United States Patent
Shichi et al.

(10) Patent No.: US 7,700,931 B2
(45) Date of Patent: Apr. 20, 2010

(54) ION BEAM PROCESSING APPARATUS

(75) Inventors: Hiroyasu Shichi, Tokyo (JP); Satoshi Tomimatsu, Kokubunji (JP); Noriyuki Kaneoka, Hitachinaka (JP); Kaoru Umemura, Tokyo (JP); Koji Ishiguro, Hitachinaka (JP)

(73) Assignee: Hitachi High-Tchnologies Corporation, Tokyo (JP)

( * ) Notice: Subject to any disclaimer, the term of this patent is extended or adjusted under 35 U.S.C. 154(b) by 329 days.

(21) Appl. No.: 11/674,262

(22) Filed: Feb. 13, 2007

(65) Prior Publication Data

US 2008/0073582 A1 Mar. 27, 2008

(30) Foreign Application Priority Data

Mar. 16, 2006 (JP) ............................... 2006-072600

(51) Int. Cl.
*G21K 5/10* (2006.01)
*H01J 37/08* (2006.01)
*A61N 5/00* (2006.01)
*G21G 5/00* (2006.01)
*G21K 7/00* (2006.01)
*G01N 23/00* (2006.01)

(52) U.S. Cl. .................. 250/492.21; 250/306; 250/310; 250/311; 250/492.1; 250/492.3

(58) Field of Classification Search ................. 250/306, 250/309–311, 492.1, 492.2, 492.21, 492.3, 250/423 R See application file for complete search history.

(56) References Cited

U.S. PATENT DOCUMENTS 4,975,586 A * 12/1990 Ray ........................ 250/492.2

(Continued)

FOREIGN PATENT DOCUMENTS

EP 1473560 A1 * 11/2004

(Continued)

*Primary Examiner*—Jack I Berman
*Assistant Examiner*—Brooke Purinton
(74) *Attorney, Agent, or Firm*—Antonelli, Terry, Stout & Kraus, LLP.

(57) ABSTRACT

The present invention provides an ion beam processing technology for improving the precision in processing a section of a sample using an ion beam without making a processing time longer than a conventionally required processing time, and for shortening the time required for separating a micro test piece without breaking the sample or the time required for making preparations for the separation. An ion beam processing apparatus is structured so that an axis along which an ion beam is drawn out of an ion source and an ion beam irradiation axis along which the ion beam is irradiated to a sample mounted on a first sample stage will meet at an angle. Furthermore, the ion beam processing apparatus has a tilting ability to vary an angle of irradiation, at which the ion beam is irradiated to the sample, by rotating a second sample stage, on which a test piece extracted from the sample by performing ion beam processing is mounted, about the tilting axis of the second sample stage. The ion beam processing apparatus is structured so that a segment drawn by projecting the axis, along which the ion beam is drawn out of the ion source, on a plane perpendicular to the ion beam irradiation axis can be at least substantially parallel to a segment drawn by projecting the tilting axis of the second sample stage on the plane perpendicular to the ion beam irradiation axis.

9 Claims, 15 Drawing Sheets

U.S. PATENT DOCUMENTS

| | | |
|---|---|---|
| 5,504,340 A | 4/1996 | Mizumura et al. |
| 6,300,628 B1 * | 10/2001 | Fujii et al. .................. 250/310 |
| 6,538,254 B1 * | 3/2003 | Tomimatsu et al. .... 250/442.11 |
| 6,664,552 B2 | 12/2003 | Shichi et al. |
| 6,781,125 B2 | 8/2004 | Tokuda et al. |
| 6,927,391 B2 | 8/2005 | Tokuda et al. |
| 7,009,192 B2 * | 3/2006 | Suzuki et al. ................ 250/306 |
| 7,095,021 B2 | 8/2006 | Shichi et al. |
| 2003/0198755 A1 | 10/2003 | Shichi et al. |
| 2006/0065854 A1 * | 3/2006 | Shichi et al. ........... 250/492.21 |
| 2007/0023651 A1 * | 2/2007 | Ishitani et al. ............... 250/309 |
| 2008/0296498 A1 * | 12/2008 | Hong .................... 250/492.21 |

FOREIGN PATENT DOCUMENTS

| | | |
|---|---|---|
| JP | 07-296764 | 11/1995 |
| JP | 7-320670 | 12/1995 |
| JP | 2000-156393 | 6/2000 |
| JP | 2002-150990 | 5/2002 |
| JP | 2004-309499 | 11/2004 |
| JP | 2004-328003 | 11/2004 |
| JP | 2005-308400 | 11/2005 |
| JP | 2006-139917 | 6/2006 |

* cited by examiner (a)   (c)   (b)

(a)

(b)

(a)

HIGH ACCELERATION PROJECTION GAS ION BEAM

DAMAGE LAYER (30nm)

(b)

LOW ACCELERATION BROAD GAS ION BEAM

15° SLANT IRRADIATION

(c)

(a)

(b)

(c)

(a)

X' Y PLANE (b)

(c)

X' Z' PLANE

Y Z' PLANE

ION BEAM PROCESSING APPARATUS

CLAIM OF PRIORITY

The present invention claims priority from Japanese application JP 2006-072600 filed on Mar. 16, 2006, the content of which is hereby incorporated by reference on to this application.

BACKGROUND OF THE INVENTION

The present invention relates to a manufacturing technology for electronic parts such as semiconductor devices. More particularly, the present invention is concerned with an ion beam processing technology for processing a section of a sample with an ion beam, or for processing a sample so as to separate a micro test piece from the sample or make preparations for the separation.

Manufacture of electronic parts such as semiconductor memories represented by a dynamic random access memory (DRAM), microprocessors, semiconductor devices including a semiconductor laser, and magnetic heads is requested to offer a high yield. This is because a decrease in the yield derived from production of a defective invites degradation of cost-effectiveness. Therefore, it is a critical problem how a defect or a foreign matter causing a defective or an imperfectly processed good is discovered in an early stage and what measures are taken. For example, at a site of manufacturing an electronic part, efforts are made to discover a defective by performing close inspection and to analyze the cause of occurrence of the defect. In an actual electronic part manufacturing process in which wafers are treated, a wafer that is being processed is inspected in order to track down the cause of an abnormality such as a defect in a circuit pattern or a foreign matter, and a countermeasure is discussed.

Normally, a scanning electron microscope (SEM) offering a high resolution is used to observe an abnormality in a sample. In recent years, a complex FIB-SEM machine that uses a focused ion beam (FIB) in combination with the SEM has been employed. In the FIB-SEM machine, the FIB is irradiated in order to form an angular hole in a desired region so that the section can be observed using the SEM.

For example, Japanese Patent Application Laid-Open No. 2002-150990 has proposed an apparatus that forms a rectangular hole near an abnormality in a sample using the FIB, observes the section of the rectangular hole using the SEM, and thus observes or analyzes a defect or a foreign matter.

Moreover, PCT International Publication WO99/05506 has proposed a technology for extracting a micro test piece, which is to be observed using a transmission electron microscope (TEM), from a bulk sample using the FIB and a probe.

Moreover, Japanese Patent Application Laid-Open No. 2000-156393 has proposed a technique of extracting a micro test piece to be inspected from a wafer without breaking the wafer, and returning the wafer, from which the micro test piece is extracted, to a production line. According to the technique, a progress in a machining process is monitored using a monitor, and a wafer is inspected or analyzed.

Moreover, Japanese Patent Application Laid-Open No. 7-320670 has proposed a technology for processing a sample, which is to be observed using the SEM, with an argon ion beam whose beam spot has a diameter of 0.1 μm and which is generated by a helicon wave ion source.

SUMMARY OF THE INVENTION

The technology for processing a sample with an ion beam so as to form a section and observing the section using an electron microscope, or the technology for separating a micro test piece from a sample using an ion beam, and observing the micro test piece using the electron microscope has an issue that should be overcome and that will be described below.

In analysis of a defective included in products of an electronic part such as a semiconductor memory or a microprocessor, simultaneous analysis of multiple regions or swift feedback of the results of analysis is intensely requested. Specifically, an analytical test piece is extracted or prepared from a discovered defective region as quickly as possible, and then inspected or analyzed. The results are fed back to a manufacturing process as quickly as possible. This is important to reduce a cost of manufacture. Under current circumstances, it takes a time ranging from 5 to 10 min to form a section using an ion beam, and it takes a time ranging from 30 to 60 min to extract a micro test piece using the ion beam. These times cannot be said to be short enough to comply with a request for a production line. How to shorten the time required for preparing an observational or analytical test piece from a sample has become an issue that should be overcome.

In the past, an ion beam whose beam spot is circular has been employed in processing that is performed using an ion beam. When the circular beam is employed, the precision in processing a section of a sample is determined with a beam diameter (a curvature of an ion beam spot). Moreover, a processing time during which the ion beam is employed is inversely proportional to an ion radiation current. In other words, the larger an ion beam current is, the shorter an ion beam processing time is. However, once the diameter of an ion beam is determined, the maximum value of the ion beam current is determined depending on the performance of an ion source or an ion optical system. The characteristics of the ion current and beam diameter are determined with a lens control value and an aperture diameter. When the aperture diameter is increased, the current increases. However, since aberrations caused by a lens are intensified, the beam diameter gets larger.

FIG. 2 illustratively shows a conventional processing procedure that employs three beam modes, which are associated with ion beam currents, for the purpose of forming a section using an ion beam. Three beam modes A, B, and C are characterized by respective beam diameters and currents. The A mode is associated with a beam diameter of approximately 1 μm and a current of approximately 10 nA, the B mode is associated with a beam diameter of approximately 200 nm and a current of approximately 3 nA, and the C mode is associated with a beam diameter of approximately 30 nm and a current of approximately 200 pA.

To begin with, an A-mode ion beam is rectangularly swept in order to form a rectangular hole. Herein, since a current is large and a beam diameter is large, a processed section is moderately curved and is therefore unsuitable for observation. A B-mode ion beam is then swept over the section in order to process the section steeply. A C-mode ion beam is then used to finish the section, whereby the section to be observed is completed. In FIG. 2, sections of electrodes and sections of plugs are seen bared on an observational section. Moreover, even when a thin film to be observed using a transmission electron microscope (TEM) is produced, a section is processed as mentioned above from both ends thereof. Herein, since the B-mode or C-mode ion beam carry a small current, it takes a long time, which is inversely proportional to the current, to complete processing. It takes a long time to complete observation. Observation of a section cannot be completed for a short period of time.

Moreover, when contamination of a silicon wafer, of which section has been observed, with gallium is avoided so that the silicon wafer can be returned to a production line, ions employed should be of a non-contaminant ion species such as inert gas or oxygen. In this case, a plasma ion source is substituted for a liquid-metal ion source. However, a luminance level offered by the ion source is lower by two or three digits. When a beam diameter is set to 0.1 μm in order to finish a section, a current produced is on the order of several picoamperes. For processing a section, one hour or more is required. Therefore, observation of a vertical section of a specific region in a device using a non-contaminant ion species has not been realized.

The present invention addresses the foregoing problems. An object of the present invention is to provide an ion beam processing technology for improving the precision in processing a section of a sample using an ion beam without extending a processing time, and shortening the time required for separating a micro test piece without breaking the sample or preparing the separation.

According to the present invention, in order to improve the precision in processing while leaving a processing time unchanged, a stencil mask or any other pattern is used to mold an ion beam into, for example, a rectangular beam. At this time, an ion beam is molded so that the steepness of one of two pairs of sides, which extend in orthogonal directions, or two of four sides of a rectangle is smaller than that of the other pair of orthogonal sides. What is referred to as steepness is a concept representing a gradient at which the intensity of an ion beam decreases from a maximum domain to zero. Quantitatively, the steepness is expressed with the width of the skew of a beam profile. The steep sides are used to process a section or a thin film serving as an electron microscopic sample. A means for controlling the steepness or the beam profile will be described in relation to embodiments later.

Moreover, for removal of neutral particles generated in an ion source or in the middle of an ion irradiation system, an axis along which an ion beam is drawn out of the ion source and an axis along which the ion beam is irradiated to a sample meet at an angle. Moreover, a mass separator is inserted into the ion irradiation system in order to remove impurity ions from the ion source. However, at this time, the steepness of an intensity profile representing an ion beam is decreased in a specific direction. Therefore, according to the present invention, a tilting direction in which the ion beam irradiation axis is tilted relative to the ion beam drawing-out axis, or a direction of mass diffusion in which the mass separator achieves mass separation and a tilting direction in which a stage is tilted are characterized for fear the specific direction will not adversely affect processing of a section or processing of a thin film serving as an electron microscopic sample. The details will be given later in relation with embodiments.

According to the present invention, an ion beam is molded or controlled so that the beam on a sample will be asymmetrical (including axial asymmetry and asymmetry relative to 90° rotation with the irradiation axis as a center) with the ion beam irradiation axis (the ray axis of an ion beam) as a center. Thus, the problems are addressed.

According to the present invention, an ion beam processing technology for improving the precision in processing of a section of a sample to be performed using an ion beam without making a processing time longer than a conventional processing time, and for shortening the time required for separating a micro test piece without breaking a sample or the time required for preparing the separation is realized to improve the yield for manufacturing a semiconductor device or the like.

DETAILED DESCRIPTION OF THE PREFERRED EMBODIMENTS

Embodiments of the present invention will be described with reference to the drawings.

First Embodiment

The present embodiment will be described on the assumption that an ion source is tilted relative to an ion beam column and a stencil mask is used to mold an ion beam.

Now, an ion source shall be a plasma ion source that draws out an ion beam of inert gas or a gas element such as oxygen or nitrogen. If inert gas or an element species such as oxygen or nitrogen is selected as an ion species for the ion source, the electric characteristics of a device will not be affected at all. Therefore, after processing is completed using an ion beam, if a processed wafer is returned to a production line, a defective will hardly be produced. In such inline application, a very small amount of metal impurity is produced in the plasma ion source. When the impurity reaches a sample, the sample may become defective, though it is rare. One of impurities is metal ions, and other impurity is metal neutral particles. Neutral particles cannot be controlled using a lens or an electrostatic deflector but are broadly irradiated to a sample. Moreover, part of ions of a gas species is neutralized at the collision against gas molecules after released from the ion source. If the neutral particles are irradiated to a sample, a portion other than a desired portion of the sample is also processed. This poses a problem in that the sample is denatured.

The present embodiment adopts a configuration in which an axis along which an ion beam is drawn out of an ion source and an axis along which the ion beam is irradiated to a sample meet at an angle for fear an impurity of neutral particles or gas neutral molecules may reach the sample.

Moreover, luminance offered by a plasma ion source is generally lower by two or three digits than that offered by a liquid metal ion source that adopts gallium (Ga) or the like. In the present embodiment, a stencil mask having openings of predetermined shapes is inserted to the middle of an ion beam irradiation system in order to produce a molded beam that projects the shape of any of the openings on a sample.

Furthermore, in the present invention, the skews of beam profiles representing an ion beam in two orthogonal directions are asymmetrical to each other. In this case, compared with the case where the skews of the beam profiles representing an ion beam in two orthogonal directions are symmetrical to each other, an ion beam current is increased and a processing time is shortened.

Figure 1:
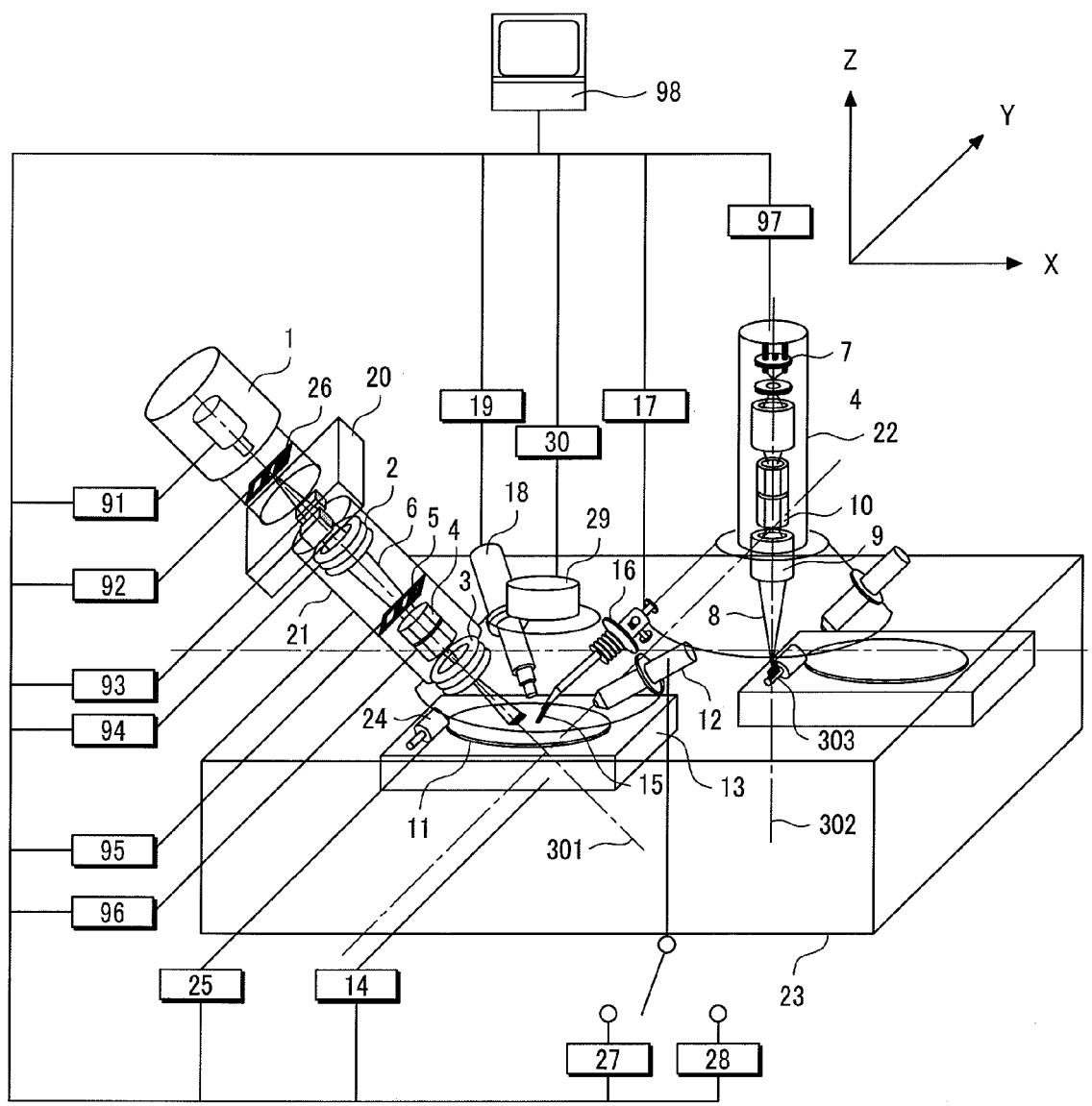
FIG. 1 is an explanatory diagram showing the configuration of an ion beam processing apparatus in accordance with the first embodiment of the present invention.
Figure 2:
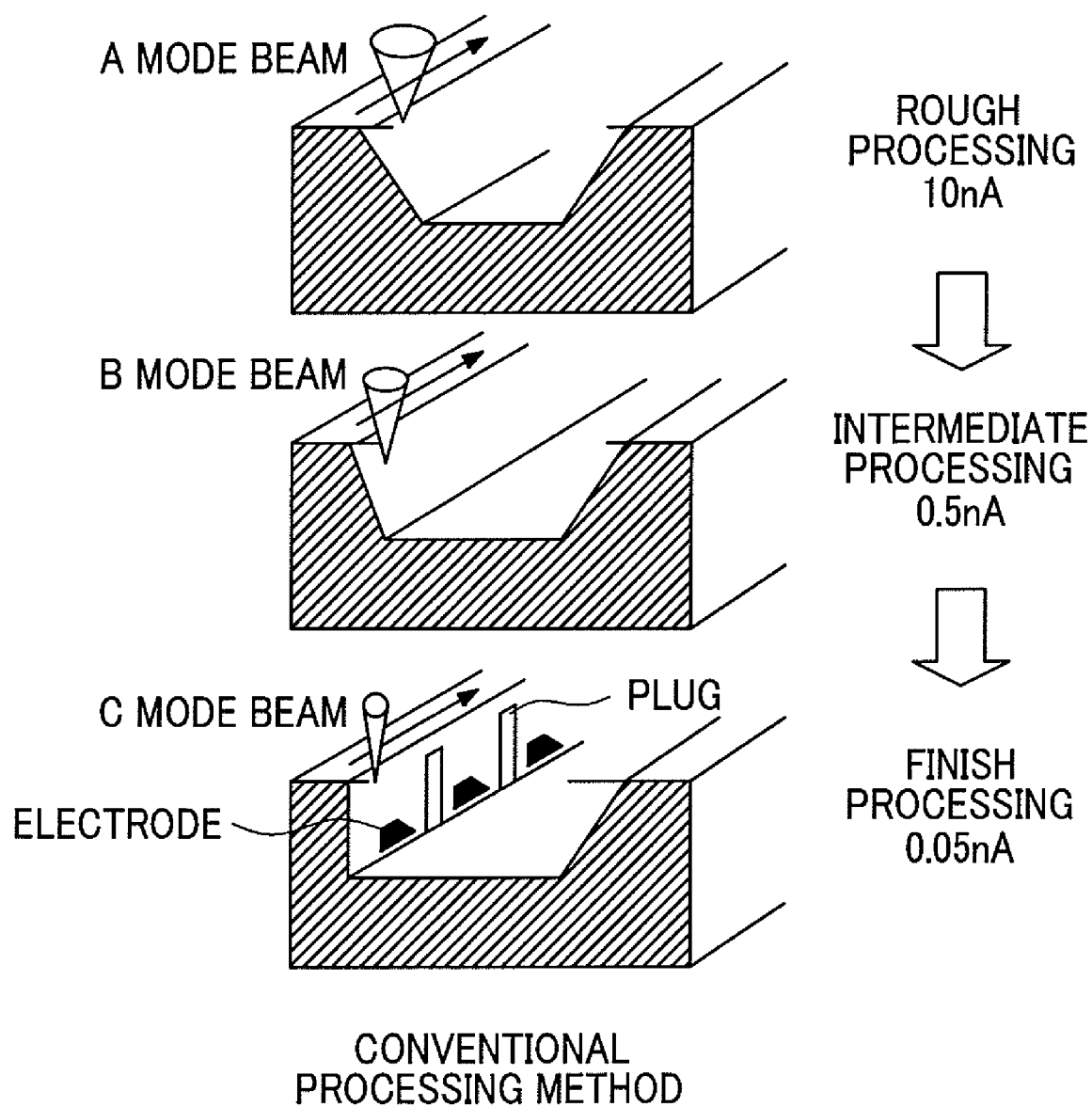
FIG. 2 illustratively and schematically shows conventional ion beam processing.

FIG. 1 shows the configuration of an ion beam processing apparatus in accordance with the first embodiment of the present invention.

The ion beam processing apparatus includes an ion beam irradiation optical system composed of a duoplasmatron 1 that releases gas ions of argon, neon, xenon, krypton, oxygen, or nitrogen, an ion beam deflector 20, an ion source aperture plate 26, a condenser lens 2, an objective lens 3, an ion beam scanning deflector 4, a stencil mask 5, and a tube 21 that serves as an ion beam column and accommodates these components. Moreover, the ion beam processing apparatus includes an electron beam irradiation optical system composed of an electron gun 7, an electron lens 9 that focuses an electron beam 8 released from the electron gun 7, an electron beam scanning deflector 10, and an electron beam column tube (scanning electron microscope (SEM) column tube) 22 that accommodates these components.

A vacuum sample chamber 23 is located below the ion beam column tube 21 and SEM column tube 22. The vacuum sample chamber 23 accommodates a first sample stage 15 on which the sample 11 is mounted, a secondary-electron detector 12, and a depositional gas source 18. Moreover, the ion beam processing apparatus includes a probe 15 that carries a test piece extracted from the sample on the first sample stage by performing ion beam processing, a manipulator 16 that drives the probe, and a second sample stage 2 on which a micro test piece 303 is mounted. Needless to say, the interior of the ion beam column tube 21 is kept in vacuum. Herein, in the ion beam processing apparatus, an irradiated sample point or a point on a sample to which the ion beam 6 is irradiated and an irradiated sample point or a point on the sample to which the electron beam 8 is irradiated are deviated from the center of the sample mounting surface and are located at different positions. In other words, an ion beam irradiation axis 301 and an electron beam irradiation axis 302 will not intersect.

Arranged as units for controlling the ion beam processing apparatus are a duoplasmatron control unit 91, an ion beam deflector control unit 92, an ion source aperture plate control unit 93, a lens control unit 94, a stencil mask control unit 95, an ion beam scanning deflector control unit 96, a first sample stage control unit 14, a second sample stage control unit 25, a manipulator control unit 17, a depositional gas source control unit 19, secondary-electron detector control units 27 and 28, an electron beam irradiation system control unit 97, and a computer system 98. Herein, the computer system 98 includes a display on which an image produced based on a detective signal sent from the secondary-electron detector 12 or information entered at an information input means is displayed.

The first sample stage 13 includes a linear movement mechanism responsible for movements in two orthogonal directions on the sample mounting surface, a linear movement mechanism responsible for movement in a direction perpendicular to the sample mounting surface, and a rotation mechanism responsible for rotation on the sample mounting surface. The first sample stage control unit 14 controls the mechanisms in response to a command sent from the computer system 98. Moreover, the second sample stage 24 is rotated about a tilting axis thereof owing to a tilting ability, whereby an angle of irradiation at which an ion beam is irradiated to a test piece is varied. The second sample stage control unit 25 controls the second sample state 24 in response to a command sent from the computer system 98. Moreover, since the second sample stage 24 is disposed on the first sample stage 13, linear movements of the second sample stage 24 in two orthogonal directions on the first sample mounting surface, linear movement thereof in a direction perpendicular to the first sample mounting surface, and rotation thereof on the sample mounting surface are achieved by moving or rotating the first sample stage 13.

The duoplasmatron 1 included in the ion beam processing apparatus is tilted with respect to the ion beam column tube 21, though the tilt is hard to see in FIG. 1. The duoplasmatron 1 is tilted in a Y direction in FIG. 1. A direction in which an ion beam is drawn out of the ion source and an ion beam irradiation axis meet at an angle.

Next, movements made in the ion beam processing apparatus will be described below. By opening a gas valve located in the middle of a pipe extending from an argon cylinder, an argon gas is introduced into the duoplasmatron 1 so that plasma will be caused by gas discharge. An ion beam is then drawn out of the duoplasmatron 1. Herein, since an axis along which the ion beam is drawn out and an axis 301 along which the ion beam is irradiated to a sample meet at an angle, the ion beam deflector 20 refracts the path of the ion beam 6. Neutral particles generated in the ion source are unsusceptible to deflection by the ion beam deflector 20, and therefore move rectilinearly as they are. The movements of the duoplasmatron 1 and ion beam deflector 20 are controlled by the duoplasmatron control unit 91 and ion beam deflector control unit 97 respectively in response to a command issued from the computer system 98, or controlled by the computer system 98. The condenser lens 2 shall focus the ion beam at a point near the center of the objective lens. A voltage to be applied to the electrodes of the condenser lens 2 is set to a value, which is calculated in advance so that the condition will be met, by the computer system. The ion beam then passes through the stencil mask having a rectangular opening. The objective lens 3 controls the stencil mask 5 under the condition that an opening in the stencil mask 5 shall be projected on a sample. Herein, a voltage to be applied to the electrodes of the objective lens 3 is set to a value, which is calculated in advance so that the condition shall be met, by the computer system 98. Consequently, a rectangularly molded ion beam is irradiated to a sample. When the molded ion beam is kept irradiated, a rectangular hole is formed in the sample.

Neutral particles collide against an aperture plate included in the ion beam irradiation system. At the time of the collision, secondary electrons may be generated due to sputtering. When a member against which the neutral particles collide is a metal, if the secondary electrons reach a sample, the sample are contaminated. Therefore, a member such as an aperture plate against which the neutral particles collide is made of an element that electrically hardly affects a sample, for example, a silicon. Moreover, an aperture plate and a mask to which an ion beam is irradiated are also made of the element. This eliminates a concern that the sample may be contaminated by sputtered metal particles. In other words, this is advantageous in improving a yield for a device manufacturing process.

Next, a sequence of movements made in the electron beam irradiation system will be described below. The electron beam 8 released from the electron gun 7 is focused by the electron lens 9 and irradiated to the sample 11. At this time, the electron beam 8 is irradiated to a section of a sample while being swept by the electron beam scanning deflector 10. Secondary electrons released from the section of the sample are detected by the secondary-electron detector 12. At this time, the sample can be observed by converting the intensities of the secondary electrons into luminance values of an image. Owing to the sample observing ability based on the electron beam, an abnormality such as a defect in a circuit pattern formed on a sample or a foreign matter can be observed. In particular, the ion beam processing apparatus is preferable for acquisition of information on an abnormality in a hole, of which depth is large for the diameter thereof, because it has a structure that an electron beam is irradiated to a sample in a direction perpendicular to the sample.

In the ion beam processing apparatus, the observing ability based on an electron beam is used to observe a section of a defect or a foreign matter in a sample, or to observe a section of an electron microscopic thin-film sample for the purpose of grasping a processing end point.

Moreover, in the ion beam processing apparatus, an ion beam-irradiated sample point and an electron beam-irradiated sample point are deviated from the center of the sample mounting surface, and located at different positions. The objective lenses are disposed near a sample without spatially interfering with each other. Therefore, the distances of the objective lenses to respective working points are short. In other words, an ion beam and an electron beam can be thinned or excellent large current performance can be provided.

Figure 3A:
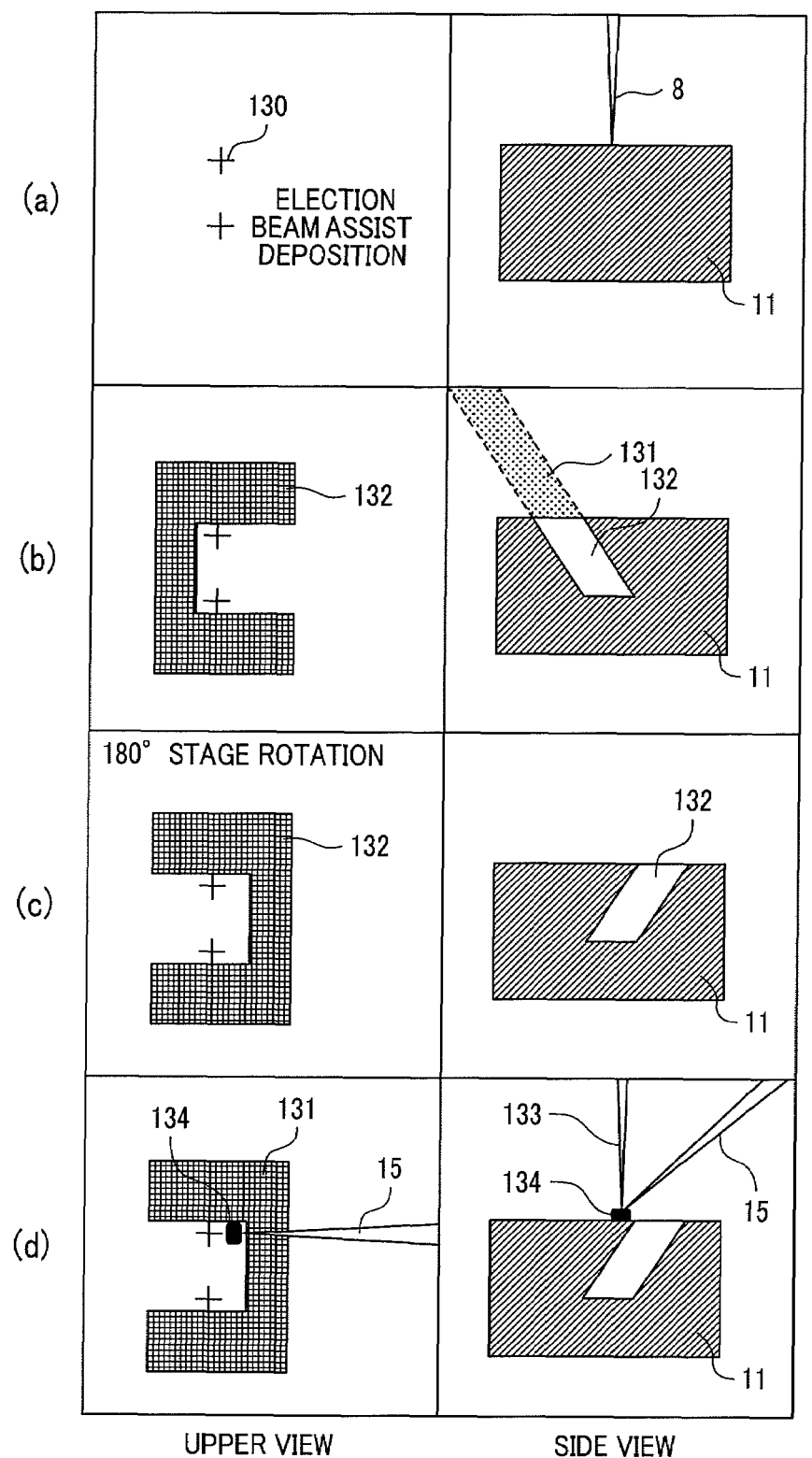
FIG. 3A includes explanatory diagrams showing a flow (a) to (d) of separating a micro test piece from a sample.
Figure 3B:
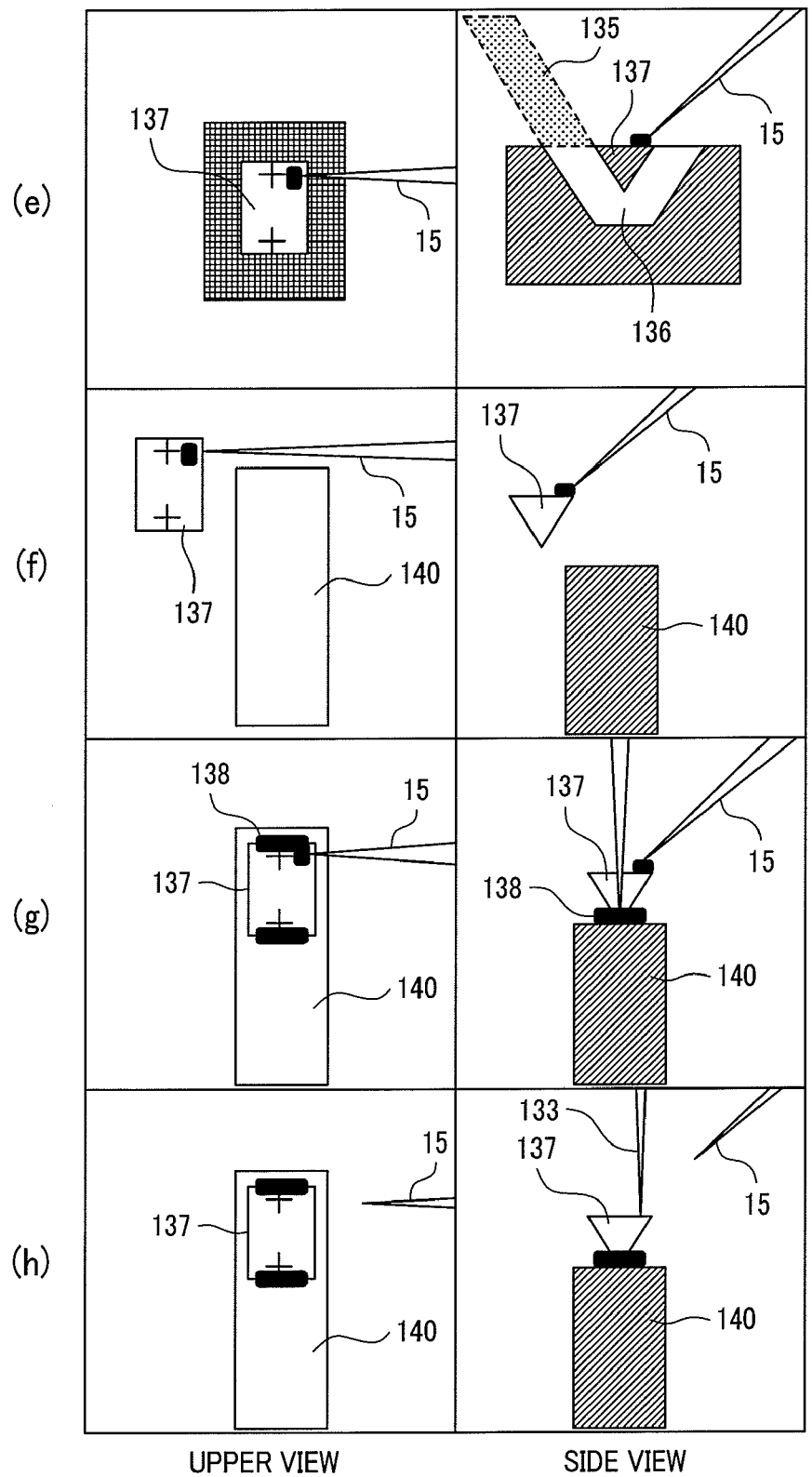
FIG. 3B includes explanatory diagrams showing the flow (e) to (h) of separating a micro test piece from a sample.

Next, a procedure of extracting a micro test piece from a sample on the first stage 13 using a molded ion beam will be described below in conjunction with FIG. 3A and FIG. 3B. The left-hand drawings included in FIG. 3A and FIG. 3B are top views in which a sample is seen from above, and the right-hand drawings included therein are side views in which the sample is seen laterally. Since the ion beam processing apparatus employs a molded ion beam whose size is on the order of micrometers, it is not always recommendable to use the ion beam to mark a processed position. The ion beam processing apparatus therefore uses an electron beam, of which size is on the order of nanometers, for the marking. Incidentally, the procedure of extracting a micro test piece will be described on the assumption that a large-diameter aperture is selected from the ion source aperture plate. The ion beam is substantially not limited, whereby the same condition as the condition established when the ion source aperture plate is absent is established. The advantage of the ion source aperture plate will be described later.

To begin with, the first sample stage 13 is moved so that an electron beam can be irradiated to a region from which a micro test piece is extracted. At a step shown in FIG. 3A(*a*), while a depositional gas is supplied, the electron beam 8 is irradiated in order to form a depositional film. Thus, two end marks 130 indicating an observational section are drawn. Specifically, while an image of a sample displayed on the screen of the display included in the computer system 98 is viewed, the marks are drawn to specify an observational position. Thus, although the ion beam processing apparatus uses a molded ion beam whose size is on the order of micrometers, the employment of the electron beam permits the drawing of the marks whose size is on the order of nanometers.

Thereafter, the first stage 13 is moved so that a first molded ion beam 131 can be irradiated to a position shown in the vicinity of the marks. Herein, the openings in the stencil mask are switched to select the opening shown in FIG. 4(*a*). At this time, a current of approximately 200 nA flows. The first molded ion beam 131 is irradiated so that the two marks will be encircled by the beam, whereby a first hole 132 of approximately 15 μm deep is formed. Thereafter, the openings of the stencil mask 5 are switched to select the circular opening shown in FIG. 4(*b*). At this time, the cross section of the beam is nearly circular. However, since the ion beam 133 falls on the sample obliquely to the sample, the spot on the sample is elliptic. The sample can be observed by scanning the sample with the elliptic spot. Incidentally, the switching of the openings is executed when a user enters a switch command at an information input means or when the computer system 98 transmits a switching control signal to the mask control mechanism.

Thereafter, as shown in FIG. 3A(*c*), the first sample stage control unit 14 causes the sample to rotate approximately 180° with an axis perpendicular to the surface of the sample as an axis of rotation. A secondary-electron image formed with secondary electrons generated from the sample due to the irradiation of the ion beam forming the elliptic spot is manipulated in order to recognize the initially formed hole. As shown in FIG. 3A(*d*), while the secondary-electron image produced by irradiating an ion beam 133 is viewed, the manipulator control unit is used to shift the position of the probe 15 so that the probe at the tip of a transporting means will come into contact with an end of the sample to be extracted. In order to fix the probe to the sample to be extracted, while a depositional gas is supplied, the ion beam is swept over the region containing the probe. Thus, a depositional film 134 is formed in the ion beam-irradiated region, and the probe is coupled to the sample to be extracted.

Figure 4:
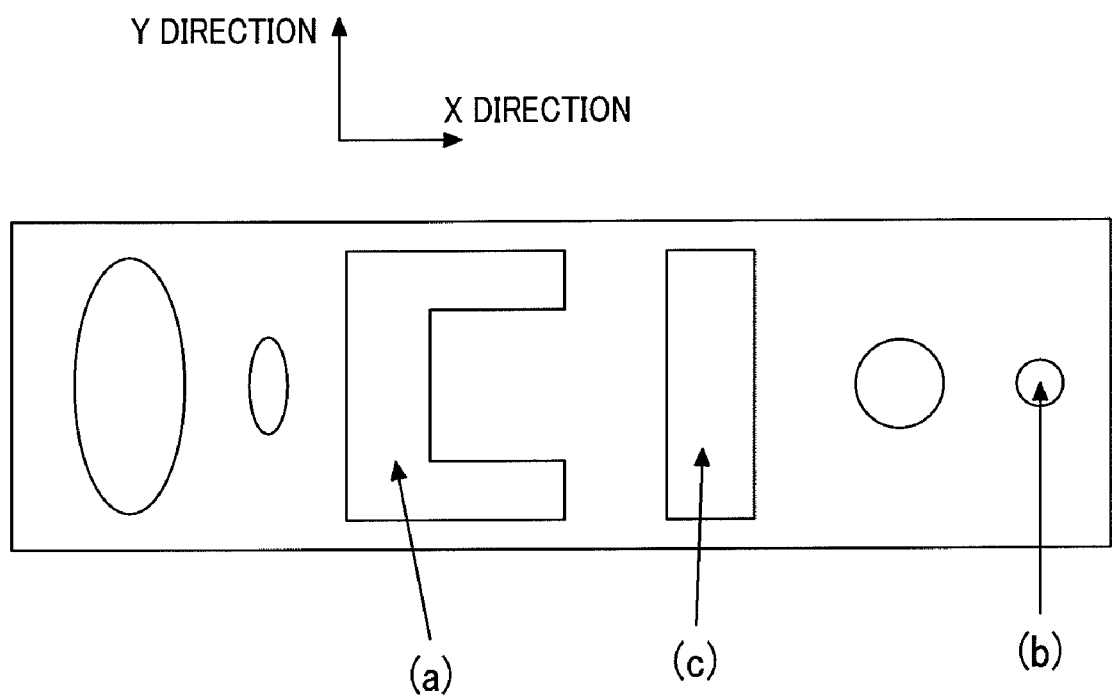
FIG. 4 shows an example of openings in a stencil mask.

Thereafter, the openings of the stencil mask 5 are switched to select the opening shown in FIG. 4(*c*). At this time, a current of approximately 80 nA flows. An irradiated sample position or a position on the sample to which a second molded beam 135 is irradiated is adjusted in advance so that it can be determined with a circular beam. As shown in FIG. 3B(*e*), the ion beam control unit is used to control the ion beam-irradiated position on the basis of sample shape information acquired by irradiating a beam that forms an elliptic spot. The second molded ion beam 135 is irradiated so that the two marks will be encircled with the second molded ion beam as it is with the first molded beam, whereby a second hole 136 of approximately 15 μm deep is formed. The hole 136 communicates with the hole 132 formed with the first molded ion beam.

Through the steps shown in FIG. 3A(a) to FIG. 3B(e), a wedge-like micro test piece 137 having a triangular section and encompassing the marks is held by the probe. Thereafter, the openings of the stencil mask are switched to select the circular opening shown in FIG. 4(b). As shown in FIG. 3B(f), while a secondary-electron image obtained by irradiating an ion beam is viewed, the manipulator control unit is used to shift the position of the probe. The micro test piece coupled to the tip of the probe is extracted and moved to the sample holder 140 on the second sample stage 24. At the step shown in FIG. 3B(g), while a depositional gas is introduced, an ion beam is irradiated to a joint between the micro test piece and the sample holder. A depositional film 138 is formed in the ion beam-irradiated region, and the micro test piece 137 is coupled to the sample holder 140. At the step shown in FIG. 3B(h), an ion beam is irradiated to the depositional film that joins the probe 15 and micro test piece. The depositional film is removed by sputtering in order to separate the probe from the micro test piece 137.

The ion beam processing apparatus in accordance with the present embodiment is characterized by the structure in which the ion beam column is tilted with respect to a sample. Owing to the structure, when a micro test piece is extracted using an ion beam, the sample stage need not be tilted but should merely be rotated.

Figure 5:
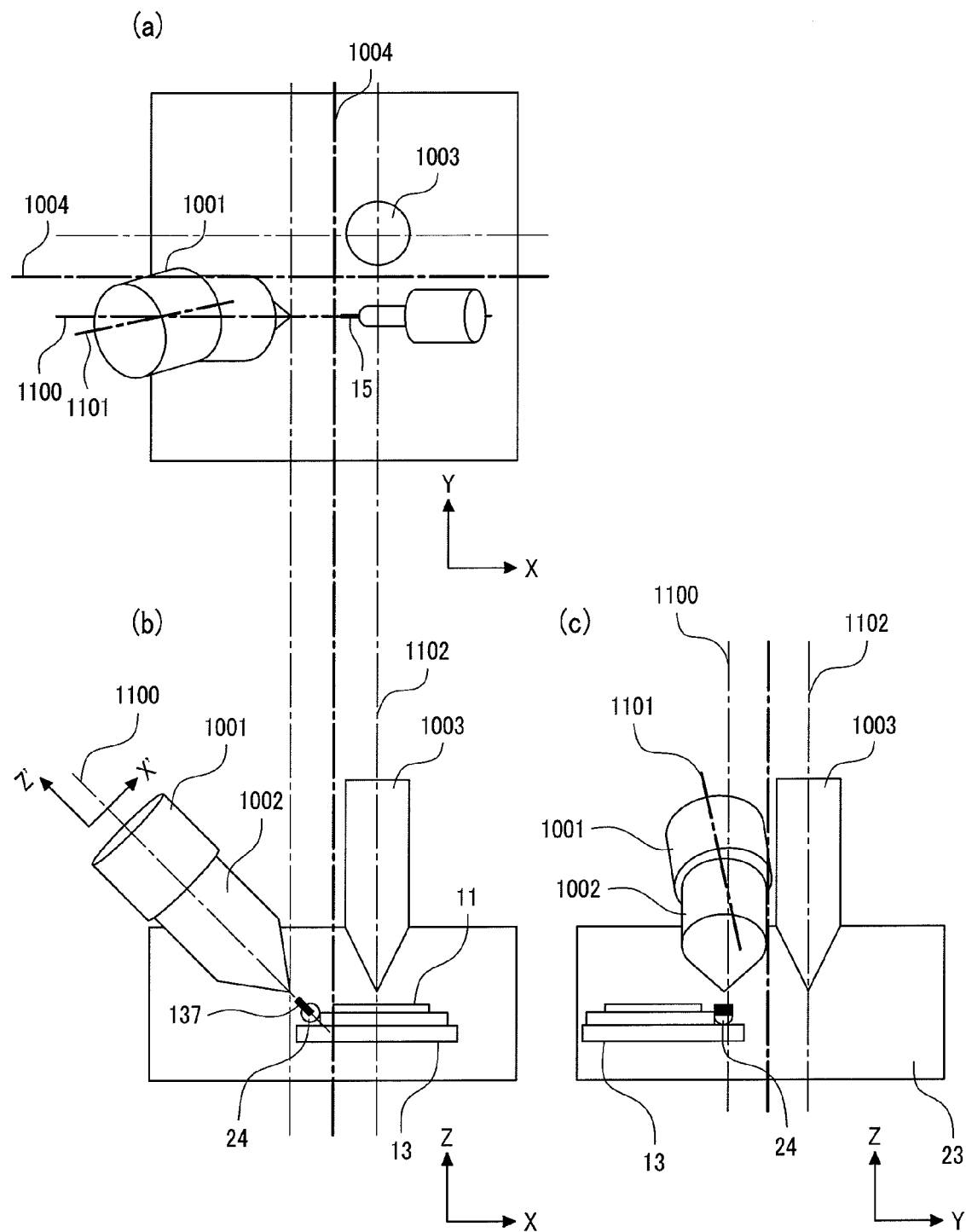
FIG. 5 shows a top view (a), a plan view (b) and a side view (c) of the ion beam processing apparatus in accordance with the first embodiment.

Next, a procedure of observing a section of a sample and producing an electron microscopic sample will be described below. In relation to the procedure, advantages provided by the features of the ion beam processing apparatus will be described in conjunction with FIGS. 5(a), (b), and (c). FIG. 5(a) shows a top view of the ion beam processing apparatus, FIG. 5(b) shows a front view thereof, and FIG. 5(c) shows a side view thereof.

Referring to FIG. 5(a), there are shown a tube 1001 accommodating a duoplasmatron, an ion beam column tube 1002 disposed under the duoplasmatron, and an electron beam column (SEM column) tube 1003 accommodating an electron source. For convenience' sake, X and Y axes are defined on the surface of the first sample stage 13, a Z axis is defined in the direction of a normal to the first sample stage, and an origin of a coordinate system is defined in the center of the first sample stage. The SEM column 1003 is disposed perpendicularly to the XY plane. Referring to FIG. 5(c), the ion beam column 1002 is tilted on the XZ plane. The tilt angle is substantially 45° relative to the Z axis.

Moreover, dot-dash lines 1004 drawn lengthwise and sideways in FIG. 5(a) are the center lines in the X and Y directions of the first sample stage. An intersection between the dot-dash lines corresponds to the center of the sample mounting surface. As already described, an ion beam-irradiated sample point and an electron beam-irradiated sample point are deviated from the center of the sample mounting surface, and located at the mutually different positions. In other words, an ion beam irradiation axis 1100 and an electron beam irradiation axis 1102 will not intersect.

As seen from the top view of FIG. 5(a), the front view of FIG. 5(b), and the side view of FIG. 5(c), the duoplasmatron 1001 is tilted relative to the ion beam column tube 1002. Specifically, an axis 1101 along which an ion beam is drawn out of the ion source and an axis 1100 along which the ion beam 6 is irradiated to the sample 11 meet at an angle. Furthermore, the ion beam processing apparatus includes the probe 15 that carries the micro test piece 137 extracted from the sample 11 on the first sample stage 13 by performing ion beam processing, and the second sample stage 24 on which the micro test piece is mounted. The ion beam processing apparatus has a tilting ability to vary an angle of irradiation, at which the ion beam is irradiated to the micro test piece, by rotating the second sample stage about a tilting axis thereof.

Moreover, the ion beam processing apparatus is characterized in that a segment drawn by projecting an axis, along which an ion beam is drawn out of the duoplasmatron 1001, on a plane perpendicular to the ion beam irradiation axis is at least substantially parallel to a segment drawn by projecting the tilting axis of the second sample stage 24 on the plane perpendicular to the ion beam irradiation axis. Otherwise, a segment drawn by projecting the axis 1101, along which an ion beam is drawn out of the duoplasmatron 1001, on the plane perpendicular to the ion beam irradiation axis is substantially parallel to the sample mounting surface of the first sample stage 13.

Figure 6:
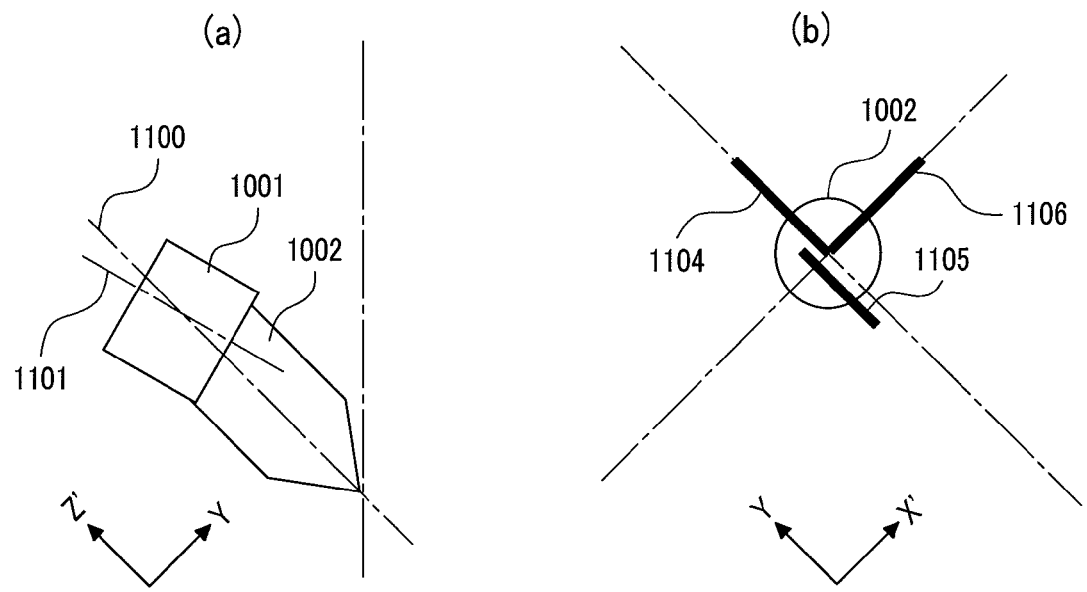
FIG. 6 includes explanatory diagrams (a) and (b) concerning the features of the ion beam processing apparatus in accordance with the first embodiment.

The above relationship of the segment will be further described in conjunction with FIGS. 6(a) and (b). In FIG. 5(b), an X' axis and a Z' axis are defined by turning 45° the X and Y axes respectively with the Y axis as an axis of rotation. The Y axis is used as it is. Namely, a plane perpendicular to the ion beam irradiation axis shall be defined as the X' Y plane, and the ion beam irradiation axis shall be defined as the Z' axis. FIG. 6(a) shows the relationship of the ion beam irradiation axis 1100 on the YZ' plane to an ion drawing-out axis 1101. Apparently, the ion beam irradiation axis 1100 and ion drawing-out axis 1101 meet at an angle. FIG. 6(b) shows the plane perpendicular to the ion beam irradiation axis, that is, the X' Y plane. In FIG. 6(b), a segment 1104 is drawn by projecting the axis 1101, along which an ion beam is drawn out of the duoplasmatron 1001, on the X' Y plane. A segment 1105 is drawn by projecting the tilting axis of the second sample stage 24 on the plane perpendicular to the ion beam irradiation axis. Apparently, the segments are substantially parallel to the Y axis. Otherwise, since the segment drawn by projecting the axis 1101, along which an ion beam is drawn out of the duoplasmatron 1001, on the plane perpendicular to the ion beam irradiation axis is substantially parallel to the Y axis, the segment is parallel to the sample mounting surface of the first sample stage 13. In contrast, the segment that is not parallel to the Y axis intersects the sample mounting surface of the first sample stage 13.

In the structure having the ion source tilted relative to the ion beam column, neutral particles generated in the ion source fly in an ion drawing-out direction but will not reach a sample because they are intercepted by a stationary aperture plate or the like. Since the sample will not be contaminated with an impurity of neutral particles, a yield for manufacturing a device will not decrease. However, the refraction of an ion beam drawn out of the ion source into the direction of the ion beam column causes the width of the skew of an intensity profile representing a projected beam to expand, and interrupts formation of a steep section. This is attributable to the fact that energy exerted by an ion differs from ion to ion. When the ion beam deflector deflects an ion beam, the trajectory of the ion beam spreads in the deflecting direction according to a difference in energy. The same applies to a molded ion beam. The width of the skew of the intensity profile expands in the direction in which an ion beam is refracted by the ion beam deflector, that is, in the Y direction. Namely, the width of the skew of the intensity profile expands in the direction of a segment 1104 shown in FIG. 6(b). Consequently, the molded ion beam to be actually irradiated to a sample has a processing edge, which is represented by a steep intensity profile, formed in the direction of a segment 1106 (X' direction in FIG. 6(b)), and has a processing edge, which is represented by a gentle intensity profile, formed in the direction of the segment 1104 (Y direction in FIG. 6(b)). Needless to say, processing precision is higher in part of a section formed by the edge represented by the steep intensity profile, and the processed section is finer. Therefore, processing is proceeded with the edge, which is represented by the steep intensity profile, brought into contact with a section.

Figure 7:
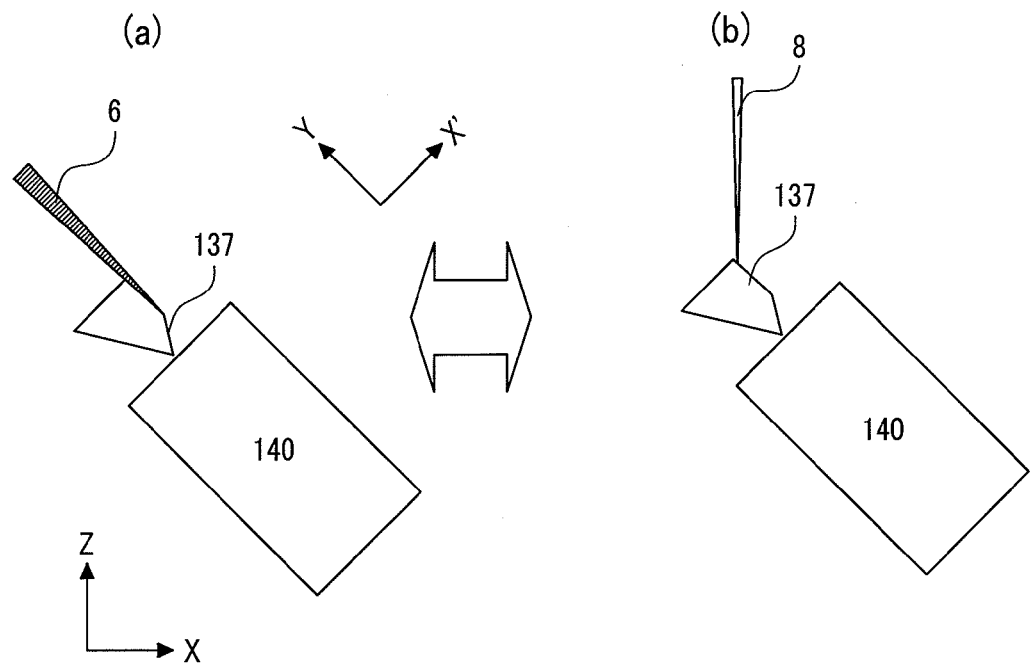
FIG. 7 includes explanatory diagrams (a) and (b) showing an example of a section observation method employed in the first embodiment.

A procedure of observing a section of a sample by utilizing the edge represented by the steep intensity profile will be described below. As shown in FIG. 7(a), the second sample stage 24 is tilted approximately 45° with the micro test piece 137, which is extracted as mentioned above, mounted on the sample holder 140, so that the ion beam 6 will be irradiated substantially in parallel with the vertical section of the sample. The molded ion beam 6 is irradiated to the section of the sample in order to finish the section so that the section will be nearly vertical to the surface of the sample. The processing edge represented by the steep intensity profile is, as mentioned above, formed in the X' direction shown in FIG. 7(a). The first sample stage 13 is moved in the X and Y directions so that the electron beam 8 will be, as shown in FIG. 7(b), irradiated to the section of the test piece. Thus, the section can be observed using the electron beam 8.

Figure 8:
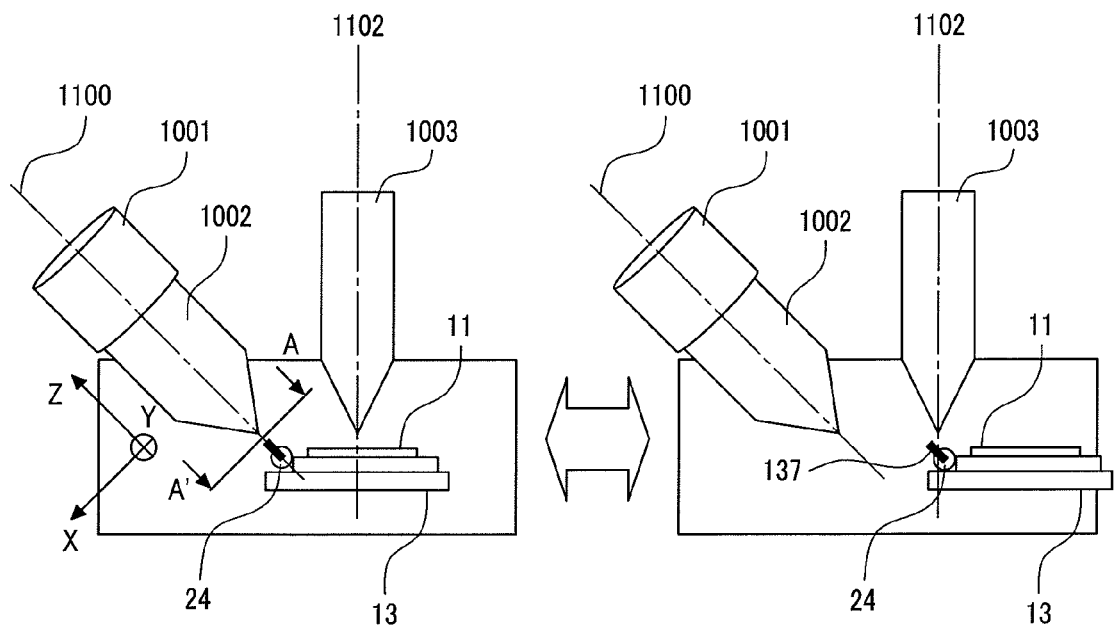
FIG. 8 shows a movement of a stage to be made for observation of a section according to the first embodiment.

FIG. 8 shows the movement of the first sample stage 13 made at this time. As seen from FIG. 8, an ion beam and an electron beam are alternately irradiated to the micro test piece 137 mounted on the second sample stage 24. Thus, a section of a sample can be steeply processed using a molded ion beam. Namely, a section of an abnormality such as a defect in a semiconductor circuit pattern or a foreign matter is formed, and the section of the defect or foreign matter is observed using the electron beam 8. Thus, the cause of the defect or foreign matter can be analyzed.

Figure 9:
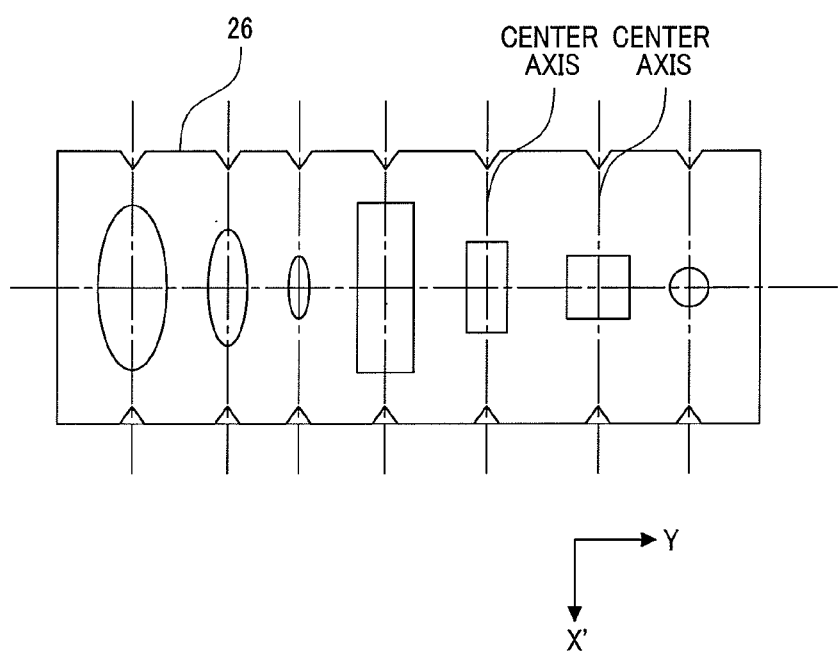
FIG. 9 shows another example of openings in a stencil mask.

A control method for controlling processing of a section with a molded ion beam by utilizing an ion source aperture plate will be described below. FIG. 9 shows an example of an ion source aperture plate 26 including axially asymmetric apertures and being employed in the present embodiment. The ion source aperture plate 26 has multiple apertures of different shapes formed therein. Any of the apertures is selected according to a processing method. The edges of the aperture plate are notched in relation to each aperture. The ion beam processing apparatus in accordance with the present embodiment includes an ion source aperture plate feeding mechanism, though FIG. 1 does not show the feeding mechanism. The notches are used to select any of the apertures. Dot-dash lines in FIG. 9 indicate the center lines in the X' and Y directions of the apertures. The intersection of the center axes indicates a center axis of each aperture. When an ion beam passes through the aperture plate, the center of the beam generally passes the center axis. Incidentally, an axially asymmetric shape refers to shapes other than a circle. In the present embodiment, the shapes to which the axially asymmetric shape refers do not include a square. This is because if the shape of an aperture were a square, the width of the skew of a beam profile would be identical in two directions of the X' and Y directions.

In the present embodiment, the ion source aperture plate shown in FIG. 9 is disposed in the processing apparatus so that the direction of the major axes of the apertures will be aligned with the X' direction shown in FIG. 5(b) and the minor axes thereof will be aligned with the Y direction shown in FIG. 5(b). Thus, when the minor axes of the apertures included in the ion source aperture plate, that is, the lateral sides of rectangles or the shorter diameters of the ellipses are aligned with the Y direction, the spread in the X' direction of an ion beam passing through the objective lens becomes smaller than the spread in the Y direction thereof. Consequently, the adverse effect of aberrations caused by the objective lens gets smaller. Consequently, the skew in the X direction of a beam profile gets steeper than the skew in the Y direction thereof. Consequently, a section of a hole processed with a molded beam gets steeper in the X' direction than in the Y direction. Moreover, an ion-beam current gets larger than it is when a beam is controlled so that it will exhibit steep profiles in the X' and Y directions respectively. In particular, when the position of the stencil mask is adjusted so that one side of a rectangular opening in the stencil mask will coincide with an irradiation axis, the width of the skew of a beam profile can be controlled to be smaller. This is attributable to the fact that aberrations caused by lenses are minimized on the ion beam irradiation axis.

Figure 10:
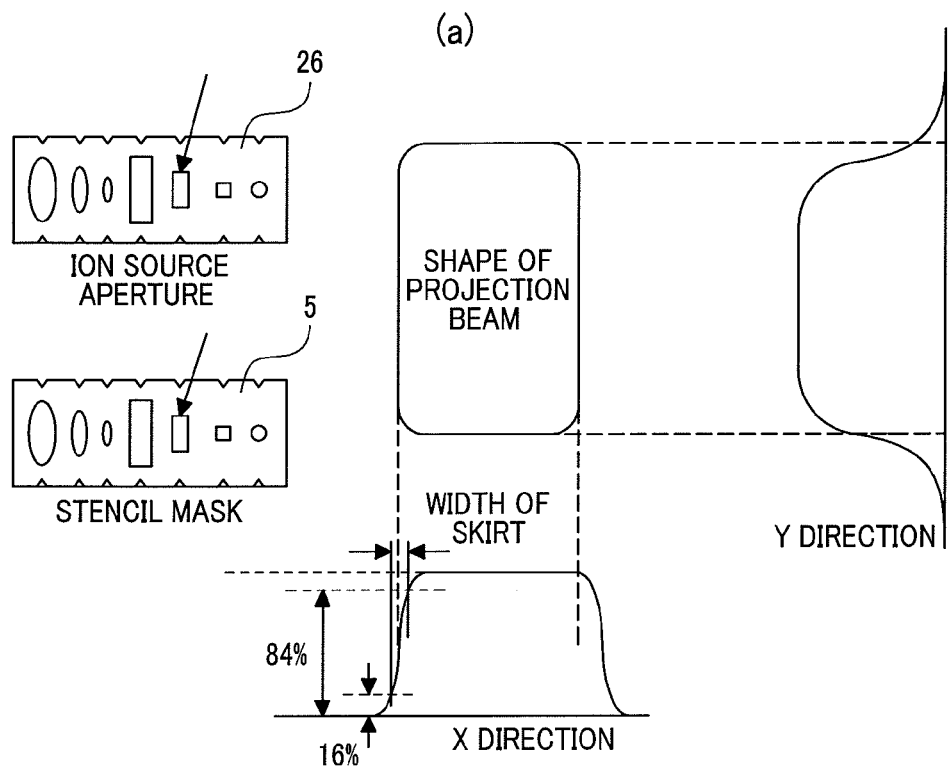
FIG. 10 shows examples (a) and (b) of ion beam molding aperture plates.
Figure 10:
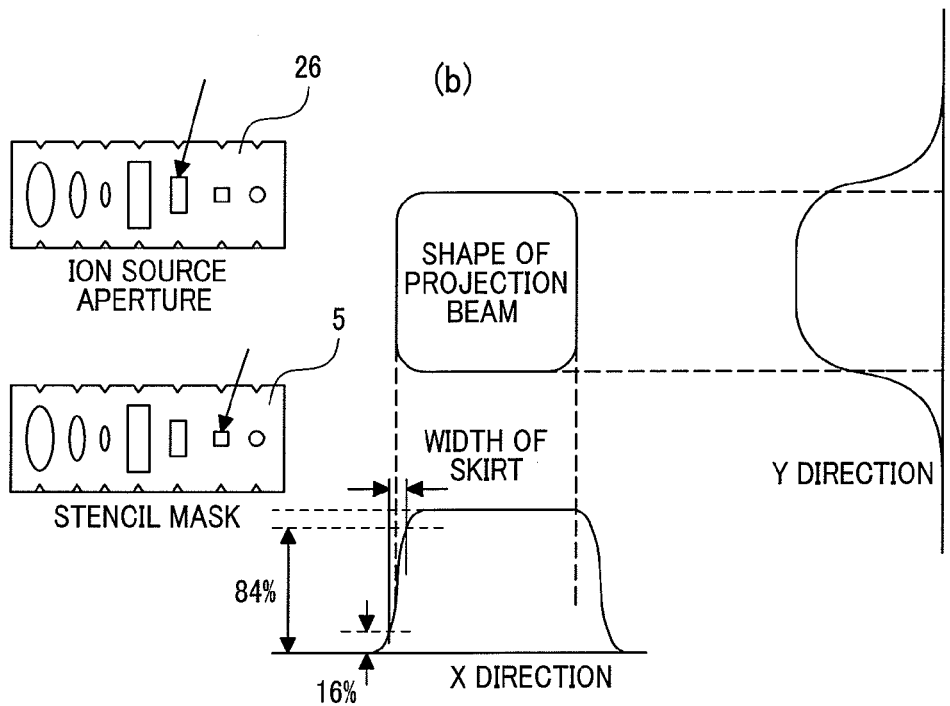

FIG. 10(a),(b) shows the shapes of molded beams produced by selecting any of the apertures in the ion source aperture plate 26 and any of the openings in the stencil mask 5, and the beam profiles thereof. Selected apertures and openings are indicated with arrows in the drawings. FIG. 10(a) is concerned with a case where the rectangular aperture in the ion source aperture place and the rectangular opening in the stencil mask are selected. A molded beam gets longer in the Y direction and has the X'-direction edge thereof represented by a steep intensity profile.

FIG. 10(b) is concerned with a case where the rectangular aperture in the ion source aperture plate and the square opening in the stencil mask are selected. A molded beam has a square cross section. Similarly to the beam shown in FIG. 10(a), the beam has an X'-direction edge thereof represented by a steep intensity profile. When any of the apertures in the ion source aperture plate is selected as mentioned above, the skew of the intensity profile can be controlled independently of the shape of a molded ion beam. Namely, a region to be processed and processing precision can be determined independently of each other.

For processing of a section of a sample on the sample holder, since an ion beam has the X'-direction edge thereof represented by a steep intensity profile, a steep section can be created. The X' direction corresponds to the tilting direction of the second sample stage 24 or the direction of the sample mounting surface of the first sample stage. Namely, the direction of projection in which the tilting axis of the second sample stage is projected on the plane perpendicular to the ion beam irradiation axis, that is, the X'Y plane is the Y direction. The asymmetry of the apertures in the ion source aperture plate is determined so that an ion beam will have an X'-direction edge thereof represented by a steeper intensity profile than in a Y-direction edge thereof. In other words, the major axes of the apertures in the ion source aperture plate included in the ion beam processing apparatus are parallel to the Y direction that is the direction of projection in which the tilting axis of the second sample stage is projected. Otherwise, the major axes of the apertures in the ion source aperture plate are parallel to the Y direction that is the direction parallel to the sample mounting surface of the first sample stage.

In other words, the ion beam processing apparatus extends control so that the width of the skew of an intensity profile, which represents an edge of a rectangular ion beam projected on a sample in a direction perpendicular to the direction of projection in which the tilting axis of the second sample stage is projected, will be smaller than the width of the skew of an intensity profile representing the other edge thereof in the direction parallel to the direction of projection in which the tilting axis of the second sample stage is projected.

Owing to the foregoing arrangement, only a surface needed for observation is processed steeply. This is advantageous in that a throughput of processing improves.

Moreover, in the ion beam processing apparatus, the ion source aperture plate may be projected on a sample using the condenser lens and objective lens. Namely, the sample can be processed in the shape of any of the apertures in the ion source aperture plate. In this case, since a magnification for projection can be varied using the two lenses of the condenser lens and objective lens, processing can be proceeded according to a desired size. Furthermore, if a lens equivalent to the condenser lens is interposed between the ion source and the ion source aperture plate, an intensity profile representing a molded beam to be irradiated to a sample can be controlled by varying the conditions for the lens.

For observation of a section, the second sample stage need not be driven. Therefore, if the first sample stage is moved back to a position from which an ion beam is irradiated to a sample, a section that is located at a position deeper than and nearly parallel to a created section can be formed and observed. Herein, the position of a section can be identified based on a change in the intensity of secondary electrons generated by sweeping a molded ion beam at least in a direction perpendicular to the section. An ion beam-irradiated position can be determined during additional processing.

Moreover, the tilting ability for the second sample stage may be used to orient a section in a direction perpendicular to an electron beam. In this case, the section can be closely observed in the perpendicular direction. Since the electron beam is irradiated in the perpendicular direction, a resolution will not be degraded by passage of the electron beam in a tilting direction. Moreover, the resolution is higher than that attained for observation of a sample at 45°. However, since a tilt angle cannot be highly precisely controlled, even if the tilt angle is returned to the original 45°, it is hard to irradiate an ion beam in parallel with a created section. In other words, even when the stage is not tilted, the structure of the ion beam processing apparatus permits repetition of processing of a section and observation.

In the ion beam processing apparatus, cutting or processing to be performed with an ion beam in order to create a section and observation to be performed with an electron beam are repeated in order to acquire three-dimensional information on the inside of a sample. A three-dimensional image can be constructed using multiple two-dimensional view images.

In the ion beam processing apparatus, the SEM column is disposed so that scanning electron microscopy (SEM) can be achieved in a perpendicular direction. However, the disposition of the SEM column need not always be perpendicular. The SEM column may be oriented in any direction as long as a section of a micro test piece can be observed.

Next, a procedure of producing a thin film as an electron microscopic sample will be described below. The three openings in the stencil mask shown in FIG. 4 are used to produce a thin film. The rectangular openings are sequentially switched so that a beam current will get smaller in the order of roughing, semi-finishing, and finishing. Similarly to the foregoing processing of a section, the asymmetry of the apertures in the ion source aperture plate is determined so that the direction of projection in which the tilting axis of the second stage is projected on the X'Y plane perpendicular to the ion beam irradiation axis will be the Y' direction, and that an ion beam will have an X'-direction edge thereof represented by a steeper intensity profile than a Y-direction edge thereof. Furthermore, the apertures in the ion source aperture plate are switched so that the steepness of the beam profile will be increased in order of roughing, semi-finishing, and finishing. Consequently, a section of a thin film can be processed steeply.

As a result of processing, part of a thin film cut from a superficial position of a sample may be produced to be thinner than the other part thereof cut from a deep position thereof. As a countermeasure, the tilt angle of the sample stage relative to the horizon is set to an angle smaller than 45° in order to process the upper part of the thin film. The tilt angle thereof is set to an angle larger than 45° in order to process the lower part of the thin film. Thus, the thin film whose sides are nearly parallel to each other can be produced.

Finally, the thin film is finished so that the thickness of an observational region will be about 100 nm or less, and thus produced as an electron microscopic sample. Thus, the TEM observational region is produced as a result of the foregoing processing. The observational region can be processed in the form of a thin film quicker than it conventionally is. In the foregoing example, an operator uses an input device included in the computer system to control the ion beam processing apparatus. Alternatively, a storage means such as a memory may be included in the computer system, and the conditions for control of all steps may be stored as a control sequence in the memory. In this case, sampling can be fully automated.

After the thin film is produced as a micro test piece, the micro test piece is introduced into the TEM sample chamber. Transmission electron microscopy (TEM) makes it possible to observe a section of a defect or a foreign matter at a higher resolution than scanning electron microscopy (SEM) does. The cause of the defect can be closely analyzed based on the results of microscopy.

Figure 11:
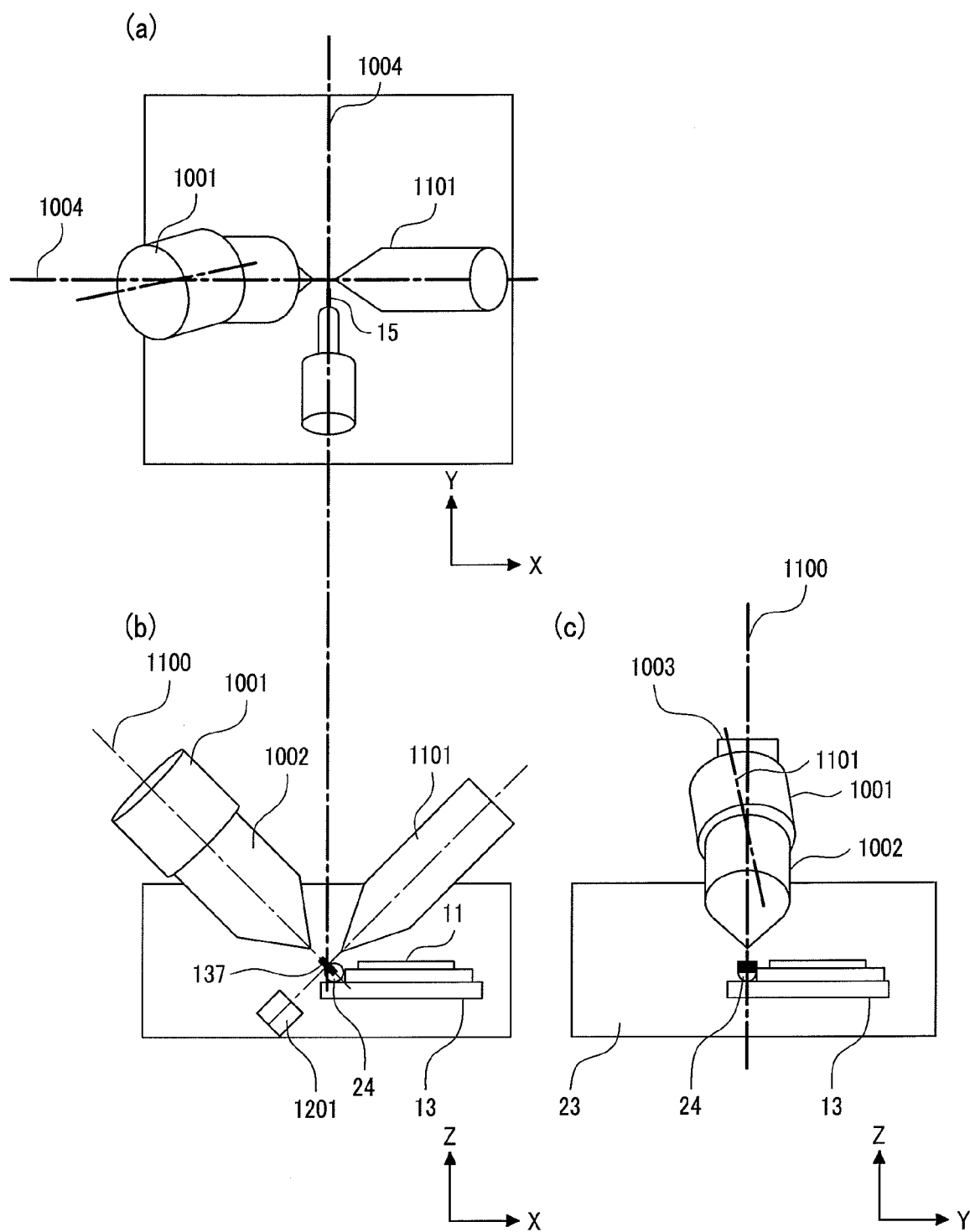
FIG. 11 shows a top view (a), a plan view (b) and a side view (c) of the ion beam processing apparatus in accordance with the first embodiment having another configuration.

Moreover, in the present embodiment, the ion beam irradiation axis and the electron beam irradiation axis will not intersect. Alternatively, the axes may intersect above a sample. The top view of FIG. 11(a), the front view of FIG. 11(b), and the side view of FIG. 11(c) show the configuration in which the axes intersect above a sample. Specifically, in an ion beam processing apparatus having the configuration, the electron beam irradiation axis exists in a plane containing a segment drawn by projecting the ion beam irradiation axis perpendicularly on a sample and the ion beam irradiation axis. In other words, as shown in FIG. 11(a), the ion beam irradiation axis and electron beam irradiation axis coexist on the same plane. As shown in FIG. 11(b), the ion beam irradiation axis meets the sample mounting surface of the first sample stage at 45°. An angle at which the ion beam irradiation axis and electron beam irradiation axis meet is 90°. In the present ion beam processing apparatus, as shown in FIGS. 11(b) and (c), unlike the processing apparatus shown in FIG. 1, a section processed with an ion beam can be observed without the necessity of moving the sample stage. Herein, the ion beam is used to repeatedly process the section, and a change in the section can be sequentially observed. The present ion beam processing apparatus gains an advantage over conventional apparatuses in that a section can be observed in a perpendicular direction. This is advantageous in that when a three-dimensional image is constructed using two-dimensional images produced according to the technique, a structure can be more faithfully reproduced.

Moreover, the present ion beam processing apparatus includes a transmission electron detector 1201 that detects electrons scattering out of an electron beam, and can therefore produce a so-called scanning transmission electron microscopic image. Since the scanning transmission electron microscopic image is produced with the energy of an electron beam increased, the image offers a higher resolution than a scanning electron microscopic image.

Figure 12:
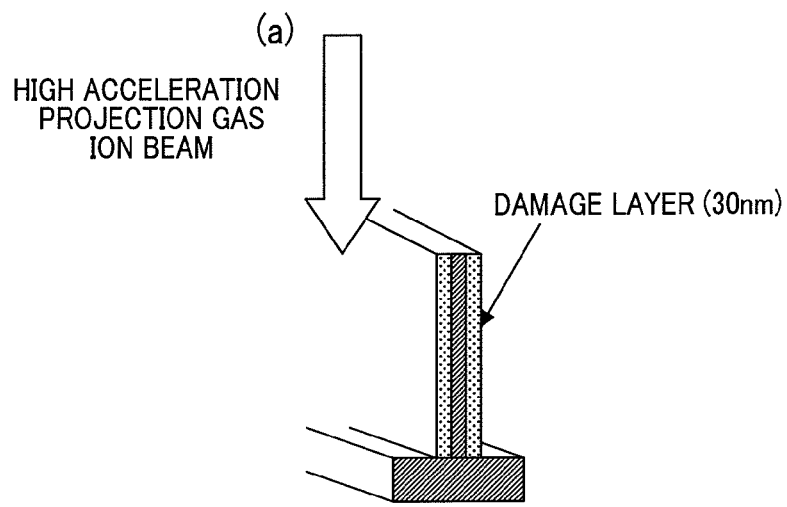
FIG. 12 is explanatory diagrams (a), (b), (c) showing a scene where damage is removed.
Figure 12:
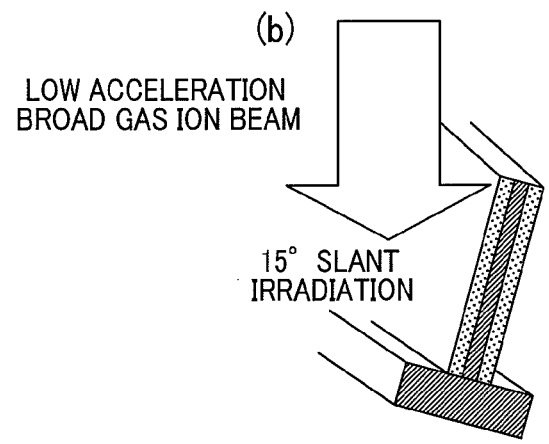
Figure 12:
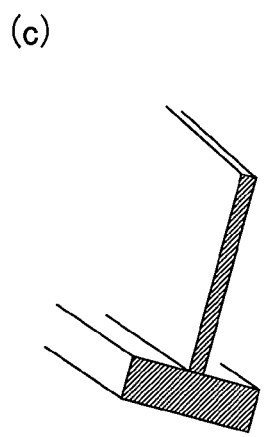

Prior to viewing of the scanning transmission electron microscopic image, a damaged layer formed on the surface of a sample is removed by irradiating an argon beam, which is produced with an accelerating voltage set to a lower voltage than that employed in the aforesaid processing, to the processed surface. At this time, the processed surface may be tilted more greatly than it is during the aforesaid processing. FIG. 12(a) to (c) illustratively show the tilting. The damaged layer (30 mm thick) is an amorphous layer even when the sample is crystalline, and becomes an obstacle to observation of a crystal structure. In the present ion beam processing apparatus, the damaged layer can be removed in the sample chamber using only one ion source. This enables observation at a high resolution. Conventionally, gallium ions are irradiated in order to process a thin film, and a gas ion irradiation apparatus is used to remove a damaged portion. The ion beam processing apparatus is more low-cost than conventional apparatuses are and offers a higher throughput while successively removing the damaged portion.

Moreover, when X-rays released from a sample to which an electron beam is irradiated are checked in order to analyze the elements of the sample, since the sample is, unlike conventionally, not contaminated with gallium, elemental analysis can be achieved despite the very low melting point of gallium. In an apparatus that uses gallium to process a thin film, the sample has to be taken out of the apparatus and to be cleaned for the purpose of obtaining a satisfactory effect. In the present ion beam processing apparatus, a sample can be kept placed in the same sample chamber. Consequently, a throughput can be improved drastically and laboriousness can be avoided.

Incidentally, the present ion beam processing apparatus may include another electron beam irradiation system disposed perpendicularly to a sample, and may thus include two electron beam irradiation systems and one ion beam irradiation system.

In the present embodiment, an axially symmetrical lens is adopted as the condenser lens. The axially symmetrical lens may be replaced with an axially asymmetrical ion beam lens realized with a double quadrupole lens. In this case, an ion beam is focused on a point near the center of the objective lens by means of the axially asymmetrical ion beam lens. The double quadrupole lens is designed to have the image plane at an equal distance in both the X' and Y directions but exhibit different powers in the respective directions. The computer system 98 determines a voltage value so that the double quadrupole lens will focus an image at a point near the center of the objective lens in both the X' and Y directions. An ion beam passes through the stencil mask that has rectangular openings. The objective lens is controlled so that it will project the stencil mask on a sample. Thus, a molded ion beam having a rectangular cross section is irradiated to the sample.

Assuming that a voltage is determined so that the double quadrupole lens will exhibit a smaller power in the X' direction than in the Y direction, the spread in the X' direction of an ion beam passing through the objective lens is smaller than that in the Y direction. Consequently, the adverse effect of aberrations caused by the objective lens diminishes. At this time, the skew in the X' direction of a beam profile is steeper than that in the Y direction. Consequently, an edge processed with the molded beam is steeper in the X' direction than in the Y direction, and is thus shaped properly for observation of a section. Moreover, an ion beam current increases compared with a case where an ion beam is controlled to have the X'-direction and Y-directions edge thereof represented by respective steep beam profiles. In particular, when the position of the stencil mask is adjusted so that one side of a rectangular opening in the stencil mask will coincide with the irradiation axis, the width of the skew of a beam profile is controlled to get smaller. What counts herein is that a direction in which an axis along which an ion beam is drawn out of an ion source is tilted should be parallel to at least a processed section to be observed. Namely, the tilt of the ion source should not adversely affect formation of a section to be observed.

In the present embodiment, a double quadrupole lens is adopted as the axially asymmetrical ion beam lens in order to control the width of the skew of a beam profile. As long as a lens is axially asymmetrically controllable, any of a quadrupole lens, an octupole lens, and a hexadecapole lens will do. A combination of the quadrupole, octupole, and hexadecapole lenses or a combination of any of the lenses with a symmetrical lens will do.

In the present embodiment, the width of the skew of a beam profile is defined as a distance between a point indicating 16% of a maximum beam intensity and a point indicating 84% thereof in order to quantitatively handle the steepness of the skew thereof (see FIG. 10A and FIG. 10B). However, any definition other than the width of the skew of a beam profile may be adopted as the definition of the steepness of the edge of a beam forming a beam spot.

Assuming that an ion beam is controlled to have both X-direction and Y-direction edges thereof represented by steep beam profiles, when the asymmetrical beam molding technique employed in the present embodiment is compared with a technique in which the ion beam is molded to be symmetrical, an ion beam current can be increased. Therefore, the beam molding technique employed in the present embodiment is preferable especially for an ion beam of a gas element such as argon or oxygen. The first embodiment has been described on the assumption that a gallium (Ga) ion beam is focused. In this case, gallium remains in a processed region. In a manufacturing process for a silicon device or any other semiconductor device, since gallium that is a heavy metal is highly likely to cause a defective, an ion beam of inert gas or a gas element such as oxygen or nitrogen that does not seriously affect the properties of a sample should preferably be used to produce a test piece. However, talking of a plasma ion source that generates gas-element ions and that is one of currently available ion sources, the luminance of the generated ion beam is lower at least by two or three digits than that of an ion beam generated by a liquid metal ion source using gallium or the like. Consequently, an ion beam is molded to be asymmetrical, and part of the ion beam represented by a steeper beam profile is used to perform actual processing. Even when the ion source suffering low luminance is employed, processing precision will not be degraded. This would prove advantageous for any ion source irrespective of whether an ion beam is of a gas element (for example, such an element as nitrogen, oxygen, neon, xenon, or krypton, or a mixture thereof).

Moreover, when the beam profiles representing the X-direction and Y-direction edges of an ion beam are symmetric, an ion beam current can be set to any value by controlling the ratio of steepness levels of the beam profiles representing the two orthogonal-direction edges. Namely, if one of the beam profiles representing the X-direction and Y-direction edges is not relatively steep, the ion beam current increases. However, since the edge of the ion beam represented by the steeper beam profile is used to process a sample, processing precision will not be degraded.

Moreover, ion beam scanning deflection electrodes included in the ion beam processing apparatus shown in FIG. 1 may be used to sweep a beam over a section. In this case, if the beam sweeping direction coincides with a direction parallel to the section, the section can be efficiently processed. Taking for instance the beam profiles shown in FIG. 10(a) and (b), if the skew of the beam profile representing the X'-direction edge of an ion beam is steeper than that of the beam profile representing the Y-direction edge thereof, it is important for the computer system to determine a rectangular region, over which the beam is swept, so that at least one side of the rectangular region in the beam sweeping direction will be parallel to the Y direction. Moreover, when the beam is not swept, a processed shape is limited to the same shape as the beam. If the ion beam can be swept, there is freedom in a beam-processed shape. Moreover, a processed region can be arbitrarily determined irrespective of the beam shape.

Moreover, the stencil mask may be provided with a mechanism for limiting one of the openings formed in the stencil mask to a small size. A molded beam having passed through the opening is swept over a sample in order to produce a sample image, and a processed position is determined using the sample image. In this case, the position can be determined highly precisely. Talking of the mechanism for limiting the opening in the mask, the stencil mask may be structured to have a small-diameter opening, or a microscopic aperture plate may be superimposed on the stencil mask. As a technique for routing a thin beam to a sample, the diameter of an ion release hole in an ion source or the diameter of an aperture for limiting a region from which ions are drawn out may be projected in a reduced size on the sample using a lens. However, in this case, since the conditions for the lens are different from those for a lens that is used to project an opening in the stencil mask on the sample, a beam irradiation axis may be deviated from a line with which it should coincide. It may therefore be necessary to adjust the beam irradiation axis. This is time-consuming. However, when an opening in the stencil mask is projected on a sample, since the conditions for the lens remain unchanged, the necessity of adjusting the beam irradiation axis is obviated.

Assuming that the diameter of an opening in the stencil mask is controlled so that the diameter of a beam that falls on a sample via a lens after passing through the opening will be smaller than the diameter of a beam that falls on the sample via a lens after passing through an ion release hole in the ion source or an ion drawing-out limitation aperture in the ion source, an advantage described below will be provided. In general, projecting conditions under which a projection lens projects an opening in the stencil mask on a sample may be determined based on calculated values of lens conditions, but cannot be determined fully satisfactorily. However, when at least the above conditions are met, if an attempt is made to determine the conditions for the projection lens under which the diameter of a beam on the sample shall be minimized, the determined conditions nearly correspond to the conditions for a projection lens that projects an opening in the stencil mask on a sample. In contrast, when the above conditions are not met, even if an attempt is made to determine the conditions for a projection lens so that the diameter of a beam on a sample will be minimized, the determined conditions are conditions under which the ion release hole in the ion source shall be projected on a sample. The conditions for the projection lens cannot be established.

Herein, the opening in the stencil mask is circular. Alternatively, the opening may be a square or a polygon at least one side of which is smaller than the diameter of the ion drawing-out limitation aperture. In this case, a nearly identical advantage is provided.

Moreover, in the present embodiment, the duoplasmatron is adopted as the ion source. Alternatively, a plasma ion source employing microwaves, a multicusp ion source, a field ionization ion source, or a liquid metal ion source will do. In particular, when a silicon ion beam alone is irradiated to a sample by removing gold and an impurity from a gold-silicon alloy using a mass separator, it will prove advantageous in that a sample will not be contaminated with an impurity in the course of manufacturing a silicon device. Furthermore, a thin beam which is hard to draw out of the plasma ion source can be produced.

Moreover, in the aforesaid embodiment, an electron beam is used to observe a section. Alternatively, an ion beam may be used for the observation. When a field ionization ion source is employed, a section can be observed at a high resolution. In this case, a shallower structure can be observed than that can with an electron beam. Otherwise, a higher resolution can be attained. As for the configuration of an apparatus, an ion beam irradiation optical system is substituted for an electron beam irradiation optical system that irradiates an electron beam to a sample. The same applies to all embodiments to be described later.

Moreover, secondary radiation to be detected by the secondary-electron detector may include secondary electrons as well as reflected electrons and secondary ions. Moreover, two secondary-electron detector control units 27 and 28 are included. The secondary-electron detector control unit 27 amplifies a dc signal sent from the detector, while the other secondary-electron detector control unit 28 measures a signal intensity level by counting the number of pulses included in the signal sent from the detector. In the latter control unit, since the number of detective particles is directly counted, a noise occurring in the detector can be removed to offer high detective sensitivity. Conventionally, it is unnecessary to count the number of pulses because an ion beam or an electron beam to be irradiated to a sample is sufficiently intense. However, especially when the field ionization ion source is employed, an ion current is small. Therefore, the detector control unit 28 that counts the number of pulses to measure a signal intensity level would prove effective. Consequently, observation can be achieved at a higher resolution than it conventionally is. However, when the number of pulses is counted, the number of pulses that can be counted is limited to about one million pulses per second. If a current to be measured is equal to or larger than a pico-ampere, the number of pulses included therein cannot be counted. Consequently, the two control units are switched according to the magnitude of a current composed of ions or electrons to be irradiated. Alternatively, the computer system 98 may be used to automatically switch the control units by monitoring a current of charged particles to be irradiated to a sample.

According to the sample production method and sample production apparatus described as the present embodiment, since neutral particles are removed, metal neutral particles generated in the plasma ion source will not reach a sample. Even when a processed wafer is returned to a production line, it is rare to generate a defective. Moreover, gas neutral particles will not be broadly irradiated to a sample. This is advantageous in overcoming an issue that a portion of a sample other than a desired portion thereof is processed and denatured.

Moreover, according to the sample production method and sample production apparatus described as the present embodiment, the employment of the stencil mask permits high-precision processing to be achieved with a large current. In particular, even if an ion source suffers low luminance, a large beam current can be produced and processing precision can be improved. Therefore, processing of a section or production of a micro test piece can be achieved shortly. This means that in a semiconductor device manufacturing process, an ion beam of inert gas or a gas element such as oxygen or nitrogen that does not seriously affect the properties of a sample can be substituted for an ion beam of gallium that is highly likely to cause a defective. Consequently, a yield for manufacturing a semiconductor device or the like can be improved without contamination of a wafer with a metal such as gallium, and a section can be formed with an ion beam. Furthermore, since a micro test piece can be separated without the necessity of breaking a wafer or preparations can be made for the separation, there is provided a novel test/analysis method making it unnecessary to dispose of a wafer for the purpose of evaluation and making it possible to return a wafer, from which a sample to be tested is extracted, to a production line without occurrence of a defective. Moreover, a wafer can be evaluated without being broken, a defective will not be newly generated, and an expensive wafer will not be wasted. Eventually, a yield for manufacturing a semiconductor device improves.

Second Embodiment

The sample production apparatus in accordance with the first embodiment includes the first sample stage and the second sample stage on which a test piece extracted by performing ion-beam processing is mounted. The present embodiment will be described as an apparatus that does not always include the second sample stage but has a tilting ability to vary an angle of irradiation, at which an ion beam is irradiated to a sample, by rotating the first stage about the tilting axis of the first stage.

Moreover, in the first embodiment, an ion beam-irradiated sample point and an electron beam-irradiated sample point are deviated from the center of the sample mounting surface, and located at mutually different positions. In the apparatus of the present embodiment, the ion beam irradiation axis and electron beam irradiation axis intersects above a sample.

In the present apparatus, an axis along which an ion beam is drawn out of an ion source and an axis along which the ion beam is irradiated to a sample meet at an angle. A segment drawn by projecting the axis, along which an ion beam is drawn out of the ion source, on a plane perpendicular to the ion beam irradiation axis may be substantially parallel to a segment drawn by projecting the tilting axis of the sample stage on the plane perpendicular to the ion beam irradiation axis. In other words, the segment drawn by projecting the axis, along which an ion beam is drawn out of the ion source, on the plane perpendicular to the ion beam irradiation axis is substantially parallel to the sample mounting surface of the sample stage. The relationship of the segment will be described below.

Figure 13:
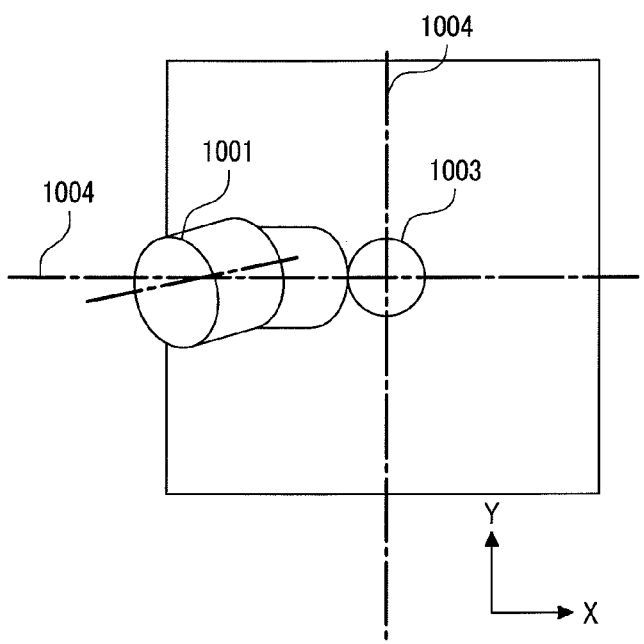
FIG. 13 shows a top view (a), a plan view (b) and a side view (c)of an ion beam processing apparatus in accordance with the second embodiment of the present invention.
Figure 13:
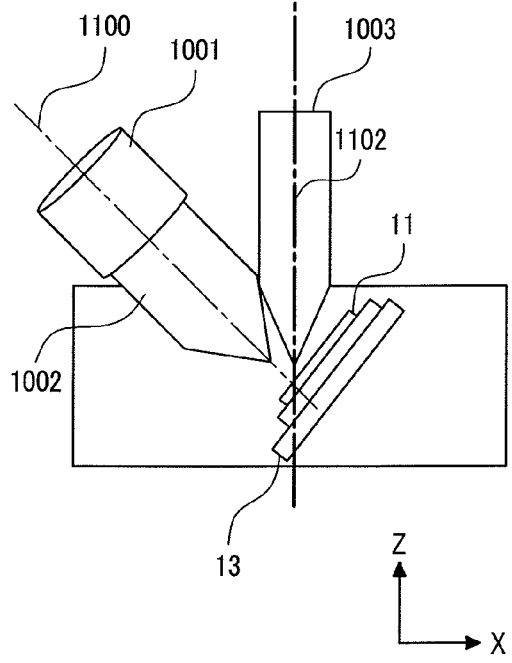
Figure 13:
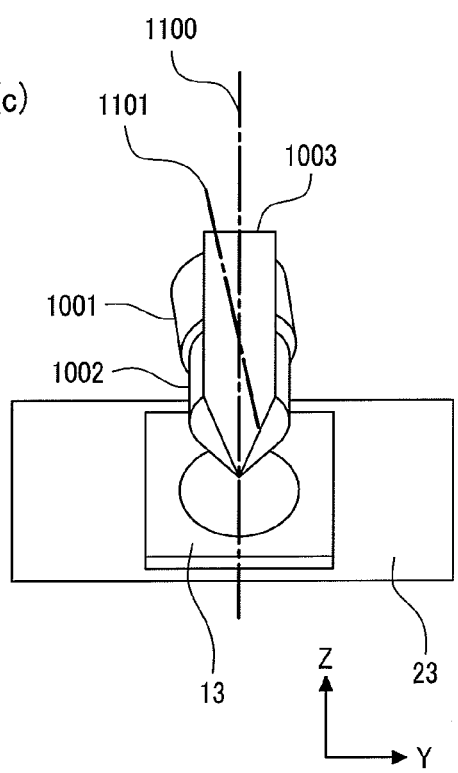

Referring to FIG. 13(a) to (c), an advantage provided by the features of the ion beam processing apparatus in accordance with the second embodiment of the present invention will be described below. FIG. 13(a) shows a top view of the ion beam processing apparatus, FIG. 13(b) shows a front view thereof, and FIG. 13(c) shows a side view thereof. The inside of the apparatus is identical to that shown in FIG. 1. The iterative description will be omitted.

In FIG. 13(a), there are shown a tube 1001 accommodating a duoplasmatron, an ion beam column tube 1002 located under the duoplasmatron, and an electron beam column tube 1003 (scanning electron microscope (SEM) column tube) including an electron source. For convenience' sake, X and Y axes are defined on a first sample stage 13, a Z axis is defined in the direction of a normal to the first sample stage, and an origin of a coordinate system is defined at the center of the first sample stage. The SEM column 1003 is disposed perpendicularly to the XY plane. In FIG. 13C, the ion beam column 1002 is tilted on the XZ plane, and the tilt angle is substantially 45° relative to the Z axis.

Moreover, dot-dash lines 1004 drawn lengthwise and sideways in FIG. 13(a) are the center lines of the sample stage extending in the X and Y directions respectively. An intersection between the dot-dash lines coincides with the center of the sample mounting surface. An ion beam-irradiated sample point and an electron beam-irradiated sample point are aligned with the center of the sample mounting surface and located at different positions. Namely, an ion beam irradiation axis 1100 and an electron beam irradiation axis 1102 intersect nearly on a line passing the center of the sample mounting surface.

As seen from the top view of FIG. 13(a), the front view of the FIG. 13(b), and the side view of FIG. 13(c), the duoplasmatron 1001 is tilted relative to the ion beam column tube 1002. Namely, an axis 1101 along which an ion beam is drawn out of the ion source and an axis 1100 along which the ion beam 6 is irradiated to a sample 11 meet at an angle. The present apparatus may or may not include a probe 15 that carries a micro test piece 137 which is extracted from the sample 11 on the sample stage 13 by performing ion-beam processing. The present apparatus has a tilting ability to vary an angle of irradiation, at which an ion beam is irradiated to a micro test piece, by rotating the sample stage 13 about the tilting axis thereof. Moreover, in the present apparatus, a segment drawn by projecting the axis, along which an ion beam is drawn out of the duoplasmatron 1001, on a plane perpendicular to the ion beam irradiation axis may be at least substantially parallel to a segment drawn by projecting the tilting axis of the sample stage 13 on the plane perpendicular to the ion beam irradiation axis. Otherwise, the segment drawn by projecting the axis 1101, along which an ion beam is drawn out of the duoplasmatron 1001, on the plane perpendicular to the ion beam irradiation axis is parallel to the sample mounting surface of the sample stage 13. This positional relationship is identical to that shown in FIG. 6(a), (b) and observed in the apparatus in accordance with the first embodiment shown in FIG. 5(a) to (c).

Even in the present apparatus, neutral particles generated in the ion source fly in an ion drawing-out direction, and are intercepted by a stationary aperture plate or the like in the middle but will not reach a sample. Namely, the sample will not be contaminated with an impurity of neutral particles. A yield for manufacturing a device will not decrease. However, when an ion beam drawn out of the ion source is refracted to the direction of the ion beam column, the width of the skew of an intensity profile of a projective beam expands. In the case of a molded ion beam, the width of the skew expands in a direction in which an ion beam is refracted by an ion beam deflector, that is, in a Y direction in FIG. 13(a) to (c). Namely, the width of the skew expands in the direction of the segment 1104 shown in FIG. 6(b). A processing edge represented by a steep beam profile is formed in the direction of the segment 1106 (X' direction in FIG. 6(b)), and a processing edge represented by a gentle beam profile is formed in the direction of the segment 1104 (Y direction in FIG. 6(b)). Naturally, part of a sample treated with the edge represented by the steep beam profile is processed with higher precision, and the processed section is satisfactory. Therefore, the edge represented by the steep beam profile is brought into contact with a section.

A procedure of observing a section of a sample using the edge represented by a steep beam profile will be described below. As shown in FIG. 13(b), the sample stage 13 is tilted approximately 45° with a sample 11 mounted thereon so that a direction perpendicular to the sample will coincide with the direction of the ion beam irradiation axis 1100. A molded ion beam 6 is irradiated to the sample so that a section will correspond to the YZ' plane shown in FIG. 6(a). The section is finished to become nearly perpendicular to the surface of the sample. As mentioned above, a processing edge represented by a steep beam profile is formed in the X' direction shown in FIG. 6(b). Thereafter, an electron beam 8 is irradiated to the section of the sample, whereby the section can be observed using the electron beam 8. Compared with the apparatus shown in FIG. 1, the present apparatus is characterized in that the sample stage need not be moved but that the section can be observed using the electron beam. Thus, the molded ion beam is used to steeply process a section of a sample. In other words, if a section of an abnormality such as a defect in a semiconductor circuit pattern or a foreign matter is formed, the section of the defect or foreign matter can be observed using the electron beam 8. The cause of the defect or foreign matter can be analyzed.

Even in the present apparatus, when a section is processed using a molded ion beam, a profile representing an ion beam may be axially asymmetrically controlled using an ion source aperture plate or an asymmetric lens.

For processing of a section of a sample on the sample stage, since an ion beam has the X'-direction edge thereof represented by a steep beam profile, the section is steeply processed. The X' direction corresponds to a tilting direction in which the sample stage is tilted, or the direction of the sample mounting surface of the first stage. Namely, the direction of projection in which the stage tilting axis is projected on the X'Y plane perpendicular to the ion-beam irradiation axis is the Y direction. The asymmetry of the apertures in the ion source aperture plate is determined so that the X'-direction edge of an ion beam will be represented by a steeper intensity profile than the Y-direction edge thereof. Namely, the present apparatus is structured so that the major axes of the apertures in the ion source aperture plate will be parallel to the direction of projection in which the stage tilting axis is projected, that is, the Y direction. Otherwise, the present apparatus is structured so that the major axes of the apertures in the ion source aperture plate will be parallel to the sample mounting surface of the stage, that is, the Y direction.

In other words, in the present apparatus, the width of the skew of an intensity profile representing an edge of an ion beam, which is projected on a sample and has a rectangular cross section, in a direction perpendicular to the direction of projection in which the stage tilting axis is projected on the sample stage surface is controlled to be smaller than the width of the skew of an intensity profile representing the other edge thereof in the direction parallel to the direction of projection in which the stage tilting axis is projected on the sample stage surface.

Owing to the foregoing arrangement, only a section that should be observed is steeply processed. This is advantageous in that a throughput of processing improves.

Moreover, even in the present apparatus, if cutting to be performed with an ion beam in order to form a section and observation to be performed using an electron beam are repeated, three-dimensional information on the inside of a sample can be acquired or a three-dimensional image can be constructed using multiple two-dimensional view images.

In the present apparatus, the SEM column is disposed so that scanning electron microscopy can be achieved in a perpendicular direction. However, the SEM column need not always be disposed perpendicularly as long as a section of a micro test piece can be observed.

According to a sample production method and sample production apparatus described as the present embodiment, neutral particles are removed. Therefore, metal neutral particles generated in the plasma ion source will not reach a sample. Even if a processed wafer is returned to a production line, a defective is rarely developed. Moreover, gas neutral particles will not be irradiated to a wide area of a sample. This is advantageous in overcoming an issue that a portion of a sample other than a desired portion is processed and denatured. Moreover, a section can be observed using an electron beam without the necessity of moving the sample stage after the completion of processing the section.

Moreover, according to the sample production method and sample production apparatus described as the present embodiment, the employment of the stencil mask permits high-precision processing to be achieved with a larger current. In particular, even if an ion source suffering low luminance is employed, a large beam current can be produced and processing precision can be improved. Consequently, processing of a section and production of a micro test piece can be achieved shortly. This means that in a semiconductor device manufacturing process, an ion beam of inert gas or a gas element such as oxygen or nitrogen that does not seriously affect the properties of a sample can be substituted for an ion beam of gallium (Ga) which is highly likely to cause a defective. Consequently, a section can be produced with an ion beam without contamination of a wafer with a metal such as gallium. Moreover, a micro test piece can be separated without breakage of a wafer or preparations can be made for the separation. Consequently, a novel test/analysis method making it unnecessary to dispose of a wafer for the purpose of evaluation and making it possible to return a wafer, from which a test piece is extracted, to a production line without occurrence of a defective can be provided in order to improve a yield for manufacturing a semiconductor device or the like. Moreover, a wafer can be evaluated without being broken, a defective will not be newly developed, and an expensive wafer will not be wasted. Eventually, a yield for manufacturing a semiconductor device improves.

Third Embodiment

In the sample production apparatuses in accordance with the first and second embodiments respectively, neutral particles generated in the plasma ion source or neutral particles generated in the middle of the column will not reach a sample. However, ions of an impurity such as a metal generated in the plasma ion source reach the sample. The present embodiment will be described as a sample production apparatus in which a mass separator is disposed in the middle of a path of an ion beam in order to trap the impurity ions. Even in the present embodiment, a beam molded by passing through an opening in a stencil mask and projected on a sample is employed.

Figure 14:
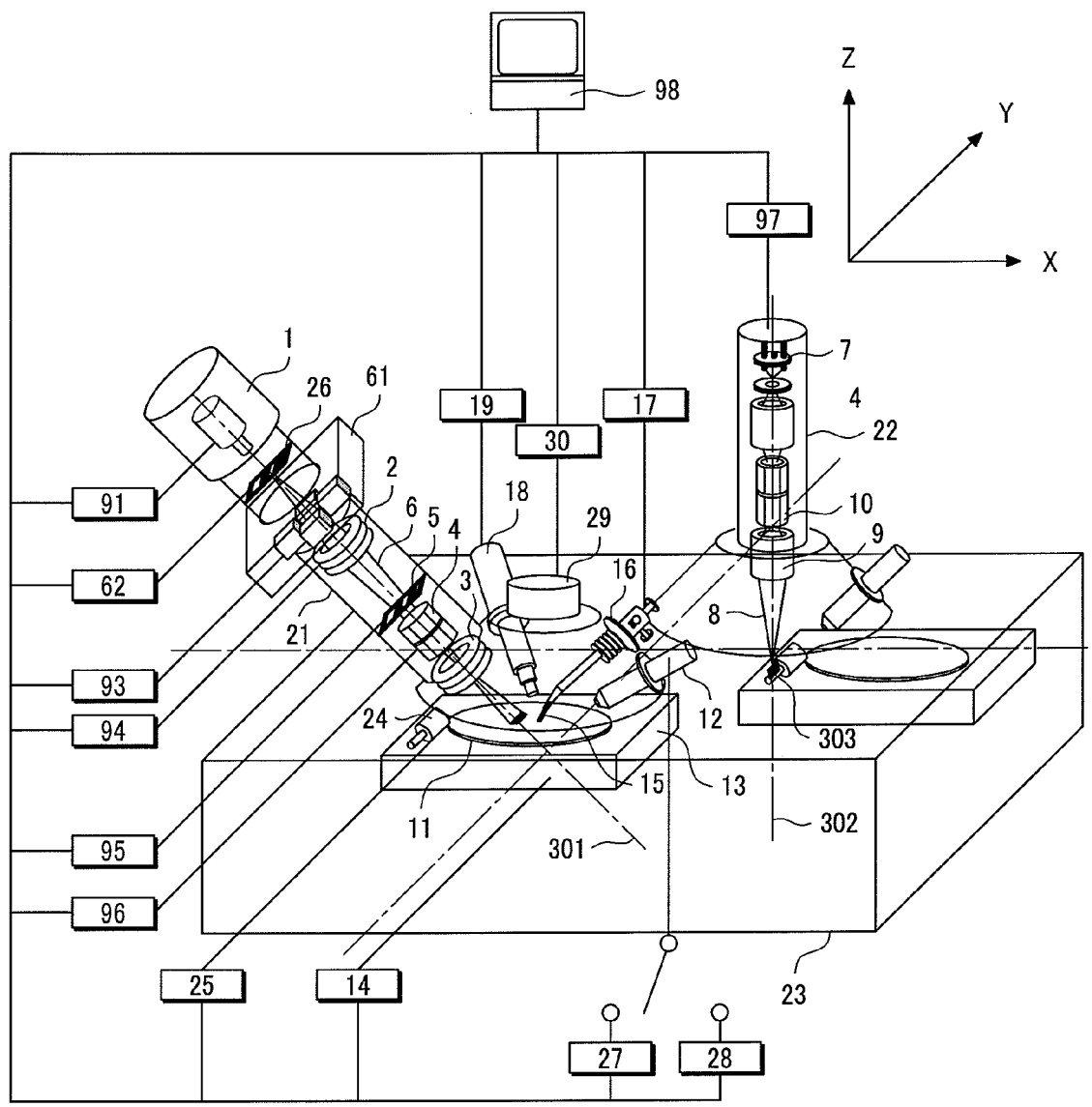
FIG. 14 is an explanatory diagram showing the configuration of an ion beam processing apparatus in accordance with the third embodiment of the present invention.

FIG. 14 shows the configuration of an ion beam processing apparatus in accordance with the third embodiment of the present invention. The ion beam processing apparatus includes an ion-beam irradiation optical system composed of a duoplasmatron 1 that releases ions of a gas such as argon, neon, xenon, krypton, oxygen, or nitrogen, a mass analyzer 61, an ion source aperture (limiting aperture) plate 26, a condenser lens 2, an objective lens 3, an ion beam scanning deflector 4, a stencil mask 5, and an ion beam column tube 21 that accommodates these components. Moreover, the ion beam processing apparatus includes an electron beam irradiation optical system composed of an electron gun 7, an electron lens 9 that focuses an electron beam 8 released from the electron gun 7, an electron beam scanning deflector 10, and an electron beam column tube (scanning electron microscope (SEM) column tube) 22 that accommodates these components.

A vacuum chamber 23 is disposed below the ion beam column tube 21 and SEM column tube 22. The vacuum chamber 23 accommodates a first sample stage 13 on which a sample 11 is mounted, a secondary-electron detector 12, a depositional gas source 18. Moreover, the ion beam processing apparatus includes a probe 15 that carries a test piece extracted from a sample on the first sample stage by performing ion beam processing, a manipulator 16 that drives the probe, and a second sample stage 24 on which a micro test piece 303 is mounted. Needless to say, the inside of the ion beam column tube 21 is kept in vacuum. Herein, in the ion beam processing apparatus, an ion beam-irradiated sample point and an electron beam-irradiated sample point are deviated from the center of the sample mounting surface and located at different positions. Namely, an ion beam irradiation axis 301 and an electron beam irradiation axis 302 will not intersect.

Disposed as units for controlling the ion beam processing apparatus are a duoplasmatron control unit 91, a mass separator control unit 62, an ion source aperture plate control unit 93, a lens control unit 94, a stencil mask control unit 95, an ion beam scanning deflector control unit 96, a first sample stage control unit 14, a second sample stage control unit 25, a manipulator control unit 17, a depositional gas source control unit 19, secondary-electron detector control units 27 and 28, an electron beam irradiation system control unit 97, and a computer system 98. Herein, the computer system includes a display on which an image produced based on a detective signal sent from the secondary-electron detector 12 or information entered at an information input means is displayed.

Movements made in the ion beam processing apparatus are nearly identical to those made in the apparatus in accordance with the first embodiment. The mass separator 61 is moved instead of the ion beam deflector 20 in order to remove impurity ions included in an ion beam. The ability of the mass separator 61 is exerted when the mass separator control unit 62 is started in response to a command sent from the computer system 98. A molded ion beam having passed through the mass separator 61, condenser lens 2, stencil mask 5, and objective lens 3 is irradiated to a sample, whereby a rectangular hole is formed. Thereafter, an electron beam released from the electron beam irradiation system is used to observe a section of a sample.

Figure 15:
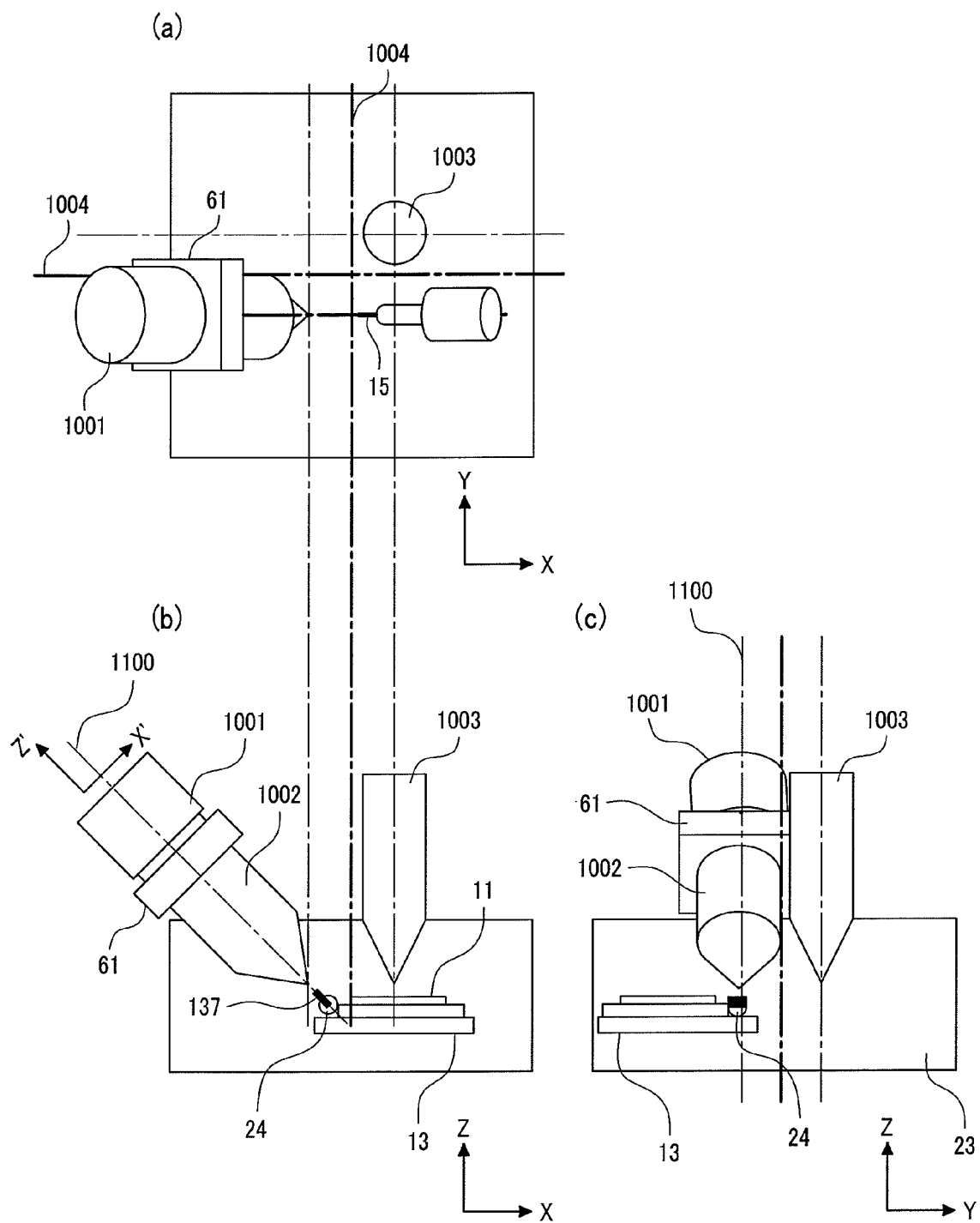
FIG. 15 shows a top view (a), a plan view (b) and a side view (c) of the ion beam processing apparatus in accordance with the third embodiment.
Figure 16:
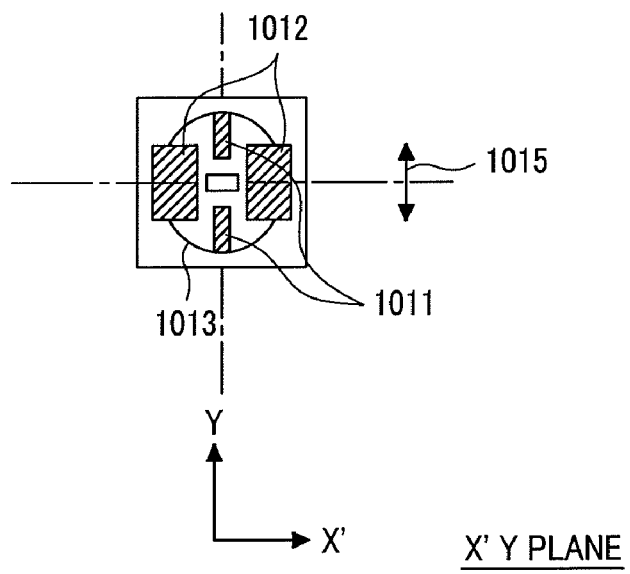
FIG. 16 includes explanatory diagrams (a), (b), (c) concerning the features of the ion beam processing apparatus in accordance with the third embodiment.
Figure 16:
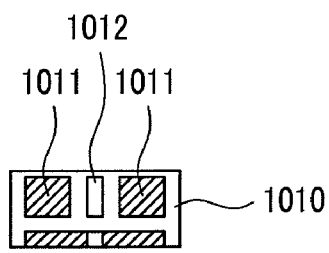
Figure 16:
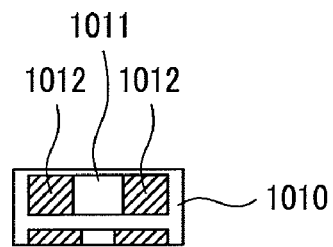
Figure 16:
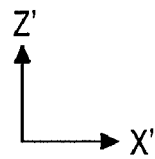
Figure 16:
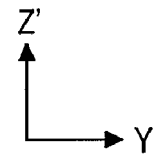

FIG. 15(a) shows a top view of the ion beam processing apparatus, FIG. 15(b) shows a front view thereof, and FIG. 15(c) shows a side view thereof, thus clarifying the structure of the mass separator, the positional relationship thereof to the electron beam tube, and the relationship thereof to a section forming direction in FIG. 14. Moreover, FIG. 16(a) to (c) shows the internal structure of the mass separator 61. In FIG. 15(a) to (c), the secondary-electron detector, depositional gas source, and manipulator are not shown.

In the top view of FIG. 15(a), the front view of the FIG. 15(b), and the side view of FIG. 15(c), there are shown a sample stage 13 that holds a sample, an ion source 1001 that generates an ion beam, an irradiation optical system 1002 that irradiates an ion beam to the sample held on the sample stage 13, a charged beam irradiation optical system 1003 that is used to observe a section processed with an ion beam, and the mass separator 61. The mass separator 61 included in the present embodiment is a so-called E×B mass separator in which an electric field and a magnetic field are developed perpendicularly to an ion beam and the direction of the electric field and the direction of the magnetic field meet at right angles. In FIG. 16(a) to (c), there are shown permanent magnets 1012, and electrostatic deflectors 1011 disposed perpendicularly to the permanent magnets 1012 and used to apply an electric field. In the present embodiment, the permanent magnets are used. Alternatively, electromagnets may be employed. Moreover, the magnetic field alone may be used for mass separation.

In this case, a path of an ion beam is refracted. A segment drawn by projecting a direction of mass diffusion, which is included in mass separation, on a plane perpendicular to an ion beam irradiation axis should merely be at least substantially parallel to a segment drawn by projecting the tilting axis of the second sample stage on the plane perpendicular to the ion beam irradiation axis. In other words, the segment drawn by projecting the direction of mass diffusion, which is included in mass separation, on the plane perpendicular to the ion beam irradiation axis is parallel to the sample mounting surface of the first sample stage. The relationship between the direction of mass separation and the depositions of the columns will be described later.

In FIG. 16(a), an arrow 1015 indicates a direction in which mass separation occurs in the E×B mass separator. Among ions incident on the mass separator, ions whose masses cause the electric fields thereof to balance with the magnetic field induced by the permanent magnets are allowed to pass through a mass separation aperture 1013. However, the mass separation causes the width of the skew of an intensity profile of a projective beam to expand, and prevents formation of a steep section. This is attributable to the fact that energy exerted by an ion differs from ion to ion. When an ion beam has ions thereof separated by the mass separator, the trajectory of the ion beam spreads in the direction of diffusion due to the difference in energy. This affects even a molded ion beam. Consequently, the width of the skew of the intensity profile expands in the direction of mass separation performed by the mass separator.

In the ion beam processing apparatus, the mass separator is disposed so that the direction of mass diffusion to be performed by the mass separator will not be parallel to a processing direction in which a section is kept dug up. Thus, an adverse effect on a processed section is avoided. The segment drawn by projecting the direction of mass diffusion, which is performed by the mass separator 61, on the plane perpendicular to the ion beam irradiation axis, that is, the X'Y plane shown in FIG. 6(b) is parallel to the Y axis. The segment drawn by projecting the tilting axis of the second sample stage on the plane perpendicular to the ion beam irradiation axis (X'Y plane) is also parallel to the Y axis. Herein, since the Y axis is parallel to the sample mounting surface of the first stage, the segment drawn by projecting the direction of mass diffusion on the plane perpendicular to the ion beam irradiation axis can be said to be parallel to the sample mounting surface of the first stage.

A technique for observing a section under the above depositions and a technique for producing an electron microscopic thin-film sample are identical to those described in relation to the apparatus shown in FIG. 1. Owing to the arrangement described in conjunction with FIG. 15(a) to (c) and FIG. 16(a) to (c), a steep section can be shortly formed using a molded ion beam, and can be observed at a high throughput using an electron beam.

The present embodiment includes the first sample stage and the second sample stage on which a test piece extracted by performing ion beam processing is mounted. The second sample stage need not always be included. The ion beam processing apparatus may have the tilting ability to vary an angle of irradiation, at which an ion beam is irradiated to a sample, by rotating the first stage about the tilting axis thereof. At this time, the ion beam irradiation axis and electron beam irradiation axis generally intersect above a sample.

Moreover, as described in relation to the first and second embodiments, the ion beam deflector for removing neutral particles generated in the ion source and the mass separator may be used in combination. Moreover, the mass separator may be tilted relative to the ion irradiation axis in order to perform removal of neutral particles and mass separation concurrently. At this time, the configuration of the apparatus can be simplified and a cost of manufacture can be reduced.

Moreover, the present embodiment adopts an argon ion beam. Alternatively, an ion beam of such an element as nitrogen, oxygen, neon, xenon, or krypton, or an ion beam of a mixture thereof will do.

Moreover, the present embodiment adopts the duoplasmatron as an ion source. Alternatively, a plasma ion source employing microwaves, a multicusp ion source, a field ionization ion source, or a liquid metal ion source will do. In particular, when the mass separator is used to remove gold or an impurity from a gold-silicon alloy for the purpose of irradiating a silicon ion beam alone to a sample, the sample will not be contaminated with the impurity in the course of manufacturing a silicon device. Furthermore, a thin beam which the plasma ion source can hardly produce can be produced.

According to the sample production method and sample production apparatus described as the present embodiment, in addition to the advantages provided by the sample production method and sample production apparatus described as the first embodiment, impurity ions such as metal ions generated in the ion source can be removed by the mass separator and will not reach a sample, and the sample will not be contaminated with the impurity. This is advantageous in that a yield for manufacturing a device will not be decreased.

Moreover, compared with a technique according to which an ion beam is controlled so that the X-direction and Y-direction edges thereof respectively will be represented by steep profiles, that is, compared with a case where the ion beam is molded symmetrically, the asymmetrical beam molding technique employed in the present embodiment can increase an ion beam current. Consequently, the beam molding technique employed in the present embodiment is preferable for an ion beam of a gas element such as argon or oxygen. In a manufacturing process for a semiconductor device such as a silicon device, an ion beam of inert gas or a gas element such as oxygen or nitrogen that does not adversely affect the properties of a sample should preferably be employed in production of a test piece. However, among currently available ion sources, a plasma ion source that generates gas-element ions suffers low luminance of a generated ion beam. Consequently, an ion beam is asymmetrically molded at the beginning, and an edge of the ion beam represented by a steeper beam profile is used to perform actual processing. Thus, even an ion source suffering low luminance may be employed without degradation of processing precision. This applies not only to ion sources that employ an ion beam of a gas element (for example, such an element as nitrogen, oxygen, neon, xenon, or krypton, or a mixture of the elements) but also to the other ion sources that suffer low luminance.

Moreover, even when an ion beam is not molded rectangularly, the problems the present invention addresses can be solved. For example, the ion beam is molded to have an elliptic cross section. When the ion beam is elliptically molded, an ion beam having two diameters, that is, a long diameter along a major axis of an ellipse and a short diameter along a minor axis thereof is produced. The short-diameter direction of a beam spot is used to process a section of a sample. Compared with a case where a circular beam is employed, precision in processing a sample is improved. For actual processing of a sample, the positional relationship between an ion beam and a sample is controlled so that the short-diameter direction of the beam will be oriented to a processed section of the processed sample.

Moreover, in the aforesaid embodiments, an electron beam is used to observe a section. Alternatively, an ion beam may be used for the observation. In particular, when a field ionization ion source is employed, a section can be observed at a high resolution. Moreover, a shallower structure can be observed than that is with an electron beam. As for the configuration of an apparatus, an electron beam irradiation optical system that irradiates an electron beam to a sample is replaced with an ion beam irradiation optical system. This is commonly applicable throughout the present application.

The present invention has been described in terms of axially asymmetrical control of an ion beam profile. For example, when the widths of the skews of beam profiles representing the edges of an ion beam in two orthogonal directions are different from each other, the beam profiles representing the X-direction and Y-direction edges need not be axially symmetrical. For example, when one of the edges, that is, the X-direction edge extends in the axial center, the width of the skew of the beam profile is minimized and smaller than the width of the skew thereof representing the other edge of the ion beam. If the width of the skew of a beam profile is different from the width of the skew of a beam profile representing either of the edges or the Y-direction edge of the ion beam, it says that the ion beam is axially asymmetric.

As described previously, according to the present invention, a processing method for shortening the time required for forming or processing a section using an ion beam, a processing method for shortening a processing time required for separating a micro test piece without breaking a wafer or a processing time required for making preparations for the separation, and an ion beam processing apparatus can be realized in order to improve a yield for manufacturing a semiconductor device. Furthermore, a processing method for shortening a section forming time in a case where inert gas ions, oxygen ions, or nitrogen ions are used as an ion beam, a processing method for shortening the time required for separating an analytic sample from a wafer or making preparations for the separation, and an ion beam processing apparatus can be realized. Furthermore, a novel test/analysis method making it unnecessary to dispose of a wafer for the purpose of evaluation and making it possible to return a wafer, from which a test piece is extracted, to a production line without occurrence of a defective can be realized.

Moreover, when an electronic part manufacturing method in accordance with the present invention is adopted, a wafer can be evaluated without being broken, a defective will not be newly produced, and an expensive wafer will not be wasted. Eventually, a yield for manufacturing an electronic part improves. Furthermore, an ion beam processing apparatus in which a method for separating an analytic sample or making preparations for the separation, a test/analysis method, and the electronic part manufacturing method can be implemented can be realized.

The present invention includes ion beam processing apparatuses and ion beam processing methods that are described below.

(1) An ion beam processing apparatus including:
a sample stage that holds a sample;
an ion source that generates an ion beam;
an ion beam irradiation optical system that irradiates the ion beam to the sample held on the sample stage; and
a charged beam irradiation optical system for use in observing a section processed with the ion beam, wherein: the ion beam processing apparatus has a tilting ability to vary an angle of irradiation, at which the ion beam is irradiated to the sample, by rotating the sample stage about the tilting axis of the sample stage;

the ion beam processing apparatus is structured so that an axis along which the ion beam is drawn out of the ion source and an ion beam irradiation axis along which the ion beam is irradiated to the sample will meet at an angle; and the ion beam processing apparatus is structured so that a segment drawn by projecting the axis, along which the ion beam is drawn out of the ion source, on a plane perpendicular to the ion beam irradiation axis can be at least substantially parallel to a segment drawn by projecting the tilting axis of the sample stage on the plane perpendicular to the ion beam irradiation axis.

(2) An ion beam processing apparatus including:
a sample stage that holds a sample;
an ion source that generates an ion beam;
an ion beam irradiation optical system that irradiates the ion beam to the sample held on the sample stage; and
a charged beam irradiation optical system for use in observing a section processed with the ion beam, wherein: the ion beam processing apparatus has a tilting ability to vary an angle of irradiation, at which the ion beam is irradiated to the sample, by rotating the sample stage about the tilting axis of the sample stage;

the ion beam processing apparatus further includes a mechanism for performing mass separation on the ion beam drawn out of the ion source; and the ion beam processing apparatus is structured so that a segment drawn by projecting a direction of mass diffusion, which is included in mass separation, on a plane perpendicular to an ion beam irradiation axis along which the ion beam is irradiated to the sample can be at least substantially parallel to a segment drawn by projecting the tilting axis of the sample stage on the plane perpendicular to the ion beam irradiation axis.

(3) An ion beam processing apparatus including:
a first sample stage that holds a sample;
an ion source that generates an ion beam;
an ion beam irradiation optical system that irradiates the ion beam to the sample held on the sample stage;
an electron beam irradiation optical system that irradiates an electron beam to the sample;
a probe means for carrying a test piece extracted from the sample by performing ion beam processing; and
a second sample stage on which the test piece is mounted, wherein: the ion beam processing apparatus has a tilting ability to vary an angle of irradiation, at which the ion beam is irradiated to the test piece, by rotating the second sample stage about the tilting axis of the second sample stage;

the ion beam processing apparatus further includes a mechanism for performing mass separation on the ion beam drawn out of the ion source; and the ion beam processing apparatus is structured so that a segment drawn by projecting a direction of mass diffusion, which is included in mass separation, on a plane perpendicular to an ion beam irradiation axis along which the ion beam is irradiated to the sample can be at least substantially parallel to a segment drawn by projecting the tilting axis of the second sample stage on the plane perpendicular to the ion beam irradiation axis.

(4) The ion beam processing apparatus set forth in (1) or (2), wherein a beam irradiation axis of the charged beam irradiation optical system for use in observation is perpendicular to an apparatus installation plane, and the ion beam irradiation axis is tilted relative to the apparatus installation plane.

(5) An ion beam processing apparatus including:
a sample stage that holds a sample;
an ion source that generates an ion beam;
an ion beam irradiation optical system that irradiates the ion beam to the sample held on the sample stage; and
a charged beam irradiation optical system for use in observing a section processed with the ion beam, wherein: the ion beam processing apparatus has a tilting ability to vary an angle of irradiation, at which the ion beam is irradiated to the sample, by rotating the sample stage about the tilting axis of the sample stage;

the ion beam irradiation optical system is an irradiation optical system that irradiates the ion beam to the sample via a mask having a desired rectangular opening; and the ion beam processing apparatus further includes a control means for extending control so that the width of the skew of an intensity profile representing an edge of the rectangular ion beam, which is projected on the sample, in a direction perpendicular to a direction in which the tilting axis of the sample stage is projected on the sample stage surface will be smaller than the width of the skew of an intensity profile representing the other edge of the ion beam in a direction parallel to the direction in which the tilting axis of the sample stage is projected on the sample stage surface.

(6) An ion beam processing apparatus including:
a sample stage that holds a sample;
an ion source that generates an ion beam;
a limiting aperture through which ions are drawn out of the ion source; and
an ion beam irradiation optical system that irradiates the ion beam to the sample held on the sample stage, wherein: the ion beam irradiation optical system is an irradiation optical system that irradiates the ion beam to the sample via a mask having an opening of a desired shape; and the mask has a polygonal or circular opening whose at least one side or whose diameter is so small that the diameter of a beam irradiated to the sample through the opening via a lens will be smaller than the diameter of a beam irradiated to the sample through an ion release hole in the ion source or the limiting aperture via the lens.

(7) An ion beam processing apparatus including:
a first sample stage that holds a sample;
an ion source that generates an ion beam;
an ion beam irradiation optical system that irradiates the ion beam to the sample held on the sample stage;
an electron beam irradiation optical system that irradiates an electron beam to the sample;
a probe means for carrying a test piece extracted from the sample by performing ion beam processing; and
a second sample stage on which the test piece is mounted, wherein: the ion beam processing apparatus has a tilting ability to vary an angle of irradiation, at which the ion beam is irradiated to the test piece, by rotating the second sample stage about the tilting axis of the second sample stage; and an electron beam irradiation axis along which the electron beam is irradiated to the sample and an ion beam irradiation axis along which the ion beam is irradiated to the sample are tilted relative to the first sample stage, and the electron beam irradiation axis and ion beam irradiation axis exist on the same plane and intersect substantially perpendicularly to each other.

(8) An ion beam processing apparatus including:
a sample stage that holds a sample;
an ion source that generates an ion beam;

an irradiation optical system that irradiates the ion beam to the sample held on the sample stage, wherein: the ion beam is used to process the sample so as to form a substantially vertical section, a test piece is extracted from the sample, or a transmission electron microscopic thin-film sample is produced;

the ion beam processing apparatus has a tilting ability to vary an angle of irradiation, at which the ion beam is irradiated to the sample, by rotating the sample stage about the tilting axis of the sample stage;

the ion beam processing apparatus is structured so that an axis along which an ion beam is drawn out of the ion source and an axis along which the ion beam is irradiated to the sample will meet at an angle; and a segment drawn by projecting the axis, along which the ion beam is drawn out of the ion source, on a plane perpendicular to the ion beam irradiation axis can be substantially parallel to the sample mounting surface of the sample stage.

(9) An ion beam processing apparatus including:
a sample stage that holds a sample;
an ion source that generates an ion beam;
an irradiation optical system that irradiates the ion beam to the sample held on the sample stage; and
a charged beam irradiation optical system for use in observing a section processed with the ion beam, wherein: the ion beam processing apparatus has a tilting ability to vary an angle of irradiation, at which the ion beam is irradiated to the sample, by rotating the sample stage about the tilting axis of the sample stage;

the ion beam processing apparatus is structured so that an axis along which the ion beam is drawn out of the ion source and an axis along which the ion beam is irradiated to the sample will meet at an angle; and a segment drawn by projecting the axis, along which the ion beam is drawn out of the ion source, on a plane perpendicular to the ion beam irradiation axis is substantially parallel to the sample mounting surface of the sample stage.

(10) An ion beam processing apparatus including:
a sample stage that holds a sample;
an ion source that generates an ion beam;
an irradiation optical system that irradiates the ion beam to the sample held on the sample stage; and
an electron beam irradiation optical system that irradiates an electron beam to the sample, wherein: the ion beam processing apparatus is structured so that an axis along which the ion beam is drawn out of the ion source and an axis along which the ion beam is irradiated to the sample will meet at an angle;

the ion beam processing apparatus further includes a probe that carries a test piece extracted from the sample by performing ion beam processing, and a second sample stage on which the test piece is mounted;

the ion beam processing apparatus has a tilting ability to vary an angle of irradiation, at which the ion beam is irradiated to the sample, by rotating the second sample stage about the tilting axis of the second sample stage; and a segment drawn by projecting the axis, along which the ion beam is drawn out of the ion source, on a plane perpendicular to the ion beam irradiation axis is substantially parallel to the sample mounting surface of he sample stage.

(11) An ion beam processing apparatus including:
a sample stage that holds a sample;
an ion source that generates an ion beam;
an irradiation optical system that irradiates the ion beam to the sample held on the sample stage; and
a charged beam irradiation optical system for use in observing a section processed with the ion beam, wherein: the ion beam processing apparatus has a tilting ability to vary an angle of irradiation, at which the ion beam is irradiated to the sample, by rotating the sample stage about the tilting axis of the sample stage;

the ion beam processing apparatus further includes a mechanism for performing mass separation on the ion beam drawn out of the ion source; and a segment drawn by projecting a direction of mass diffusion, which is included in mass separation, on a plane perpendicular to the ion irradiation axis is substantially parallel to the sample mounting surface of the sample stage.

(12) An ion beam processing apparatus including:
a first sample stage that holds a sample;
an ion source that generates an ion beam;
an irradiation optical system that irradiates the ion beam to the sample held on the sample stage;
an electron beam irradiation optical system that irradiates an electron beam to the sample;
a probe that carries a test piece extracted from the sample by performing ion beam processing; and
a second sample stage on which the test piece is mounted, wherein: the ion beam processing apparatus has a tilting ability to vary an angle of irradiation, at which the ion beam is irradiated to the test piece, by rotating the second sample stage about the tilting axis of the second sample stage;

the ion beam processing apparatus further includes a mechanism for performing mass separation on the ion beam drawn out of the ion source; and a segment drawn by projecting a direction of mass diffusion, which is included in mass separation, on a plane perpendicular to the ion irradiation axis is parallel to the sample mounting surface of the first sample stage.

(13) An ion beam processing apparatus in which a beam irradiation axis of a charged beam irradiation optical system for use in observation is perpendicular to an apparatus installation plane, and an ion beam irradiation axis is tilted relative to the apparatus installation plane.

(14) An ion beam processing apparatus in which a beam irradiation axis of an electron beam irradiation optical system is perpendicular to an apparatus installation plane, and an ion beam irradiation axis is tilted relative to the apparatus installation plane.

(15) An ion beam processing apparatus structured so that an electron beam irradiation axis and an ion beam irradiation axis intersect substantially above a sample.

(16) An ion beam processing apparatus including:
a sample stage that holds a sample;
an ion source that generates an ion beam; and
an irradiation optical system that irradiates the ion beam to the sample held on the sample stage, wherein: the ion beam irradiation optical system is a projective ion beam irradiation optical system that irradiates an ion beam to the sample via a mask having an opening of a desired shape, and includes at least two ion beam lenses and at least two mask driving mechanisms or aperture driving mechanisms capable of changing openings.

(17) An ion beam processing apparatus including:
a first sample stage that holds a sample;
an ion source that generates a first ion beam;
an irradiation optical system that irradiates the first ion beam to the sample held on the sample stage;
a field ionization ion source that generates a second ion beam;
an ion beam irradiation optical system that irradiates the second ion beam to the sample;
a probe that carries a test piece extracted from the sample by performing first ion beam processing; and a second sample stage on which the test piece is mounted, wherein: the ion processing apparatus has a tilting ability to vary an angle of irradiation, at which the ion beam is irradiated to the test piece, by rotating the second sample stage about the tilting axis of the second sample stage; and an irradiation axis along which the first ion beam is irradiated and an irradiation axis along which the second ion beam is irradiated are tilted relative to the first sample stage, exist on the same plane, and intersect substantially perpendicularly.

(18) An ion beam processing apparatus including:

a sample stage that holds a sample;

a field ionization ion source that generates a gas ion beam;

an irradiation optical system that irradiates the gas ion beam to the sample held on the sample stage; and a secondary-electron detector capable of detecting secondary electrons or reflected electrons released from the sample, wherein: the ion beam processing apparatus further includes at least two control units each including a signal amplifier for amplifying a signal sent from the secondary-electron detector; and one of the control units amplifies a dc voltage of a detective signal, and the other control unit measures a signal intensity level by counting the number of signal pulses.

(19) An ion beam processing apparatus including:

a sample stage that holds a sample;

a field ionization ion source that generates a gas ion beam;

an irradiation optical system that irradiates the gas ion beam to the sample held on the sample stage; and a secondary-electron detector capable of detecting secondary electrons or reflected electrons released from the sample, wherein: the ion beam processing apparatus further includes at least two control units each including a signal amplifier for amplifying a signal sent from the secondary-electron detector, measures a current to be irradiated to the sample, and switches the two secondary-electron detector control units according to the current value.

(20) An ion beam processing method to be implemented in an ion beam processing apparatus which includes a sample stage that holds a sample, an ion source that generates a gas ion beam, and an irradiation optical system that irradiates an ion beam to the sample held on the sample stage, in which the gas ion beam irradiation optical system is a projective ion beam irradiation optical system that irradiates an ion beam to the sample through a mask, which has an opening of a desired shape, under the condition that the opening in the mask will be projected on the sample via a lens, and in which a gas ion beam produced using a first accelerating voltage is used to process the sample in order to produce a transmission electron microscopic thin-film sample, wherein:

in the same vacuum sample chamber, the gas ion beam is irradiated to a processed surface of the transmission electron microscopic thin-film sample with an accelerating voltage set to a voltage lower than the first accelerating voltage.

(21) An ion beam processing apparatus including:

a sample stage that holds a sample;

an ion source that generates an ion beam;

an irradiation optical system that irradiates the ion beam to the sample held on the sample stage, wherein: the ion beam is used to process the sample in order to form a substantially vertical section, a test piece is extracted from the sample, or a transmission electron microscopic thin-film sample is produced;

an axis along which the ion beam is drawn out of the ion source and an axis along which the ion beam is irradiated to the sample meet at an angle; and a member against which neutral particles generated in the ion source or an intermediate vacuum chamber collide is made of a silicon.

What is claimed is:

1. An ion beam processing apparatus comprising:

a sample stage that holds a sample;

an ion source that generates an ion beam;

an ion beam irradiation optical system that irradiates the ion beam to the sample held on the sample stage;

a charged particle beam irradiation optical system that observes a section of the sample processed by the ion beam;

wherein the ion beam processing apparatus has a tilting ability to vary an angle of irradiation, at which the ion beam is irradiated to the sample, by rotating the sample stage about the tilting axis of the sample stage;

wherein the ion beam processing apparatus is structured so that an axis along which the ion beam is drawn out of the ion source and an ion beam irradiation axis along which the ion beam is irradiated to the sample will meet at an angle;

wherein the ion beam processing apparatus is structured so that a segment drawn by projecting the axis, along which the ion beam is drawn out of the ion source, on a plane perpendicular to the ion beam irradiation axis is substantially parallel to a segment drawn by projecting the tilting axis of the sample stage on the plane perpendicular to the ion beam irradiation axis;

wherein the ion beam processing apparatus is structured so that the segment drawn by projecting the axis, along which the ion beam is drawn out of the ion source, on the plane perpendicular to the ion beam irradiation axis is substantially parallel to the processed section of the sample.

2. The ion beam processing apparatus comprising:

a first sample stage that holds a sample;

an ion source that generates an ion beam;

an ion beam irradiation optical system that irradiates the ion beam to the sample held on the first sample stage; and an electron beam irradiation optical system that irradiates an electron beam to a section of the sample processed by the ion beam;

wherein the ion beam processing apparatus is structured so that an axis along which the ion beam is drawn out of the ion source and an ion beam irradiation axis along which the ion beam is irradiated to the sample will meet at an angle;

wherein the ion beam processing apparatus further comprises a probe means for carrying a test piece extracted from the sample by performing ion beam processing, and a second sample stage on which the test piece is mounted;

wherein the ion beam processing apparatus has a tilting ability to vary an angle of irradiation, at which the ion beam is irradiated to the sample, by rotating the second sample stage about the tilting axis of the second sample stage;

wherein the ion beam processing apparatus is structured so that a segment drawn by projecting the axis, along which the ion beam is drawn out of the ion source, on a plane perpendicular to the ion beam irradiation axis is substantially parallel to a segment drawn by projecting the tilting axis of the second sample stage on the plane perpendicular to the ion beam irradiation axis; and wherein the ion beam processing apparatus is structured so that the segment drawn by projecting the axis, along which the ion beam is drawn out of the ion source, on the plane perpendicular to the ion beam irradiation axis is substantially parallel to the processed section of the sample.

3. The ion beam processing apparatus according to claim 1, further comprising:
an electron beam irradiation optical system;
wherein an electron beam irradiation axis of the electron beam irradiation optical system is perpendicular to an apparatus installation plane, and
the ion beam irradiation axis is tilted relative to the apparatus installation plane.

4. The ion beam processing apparatus according to claim 2, wherein an electron beam irradiation axis of the electron beam irradiation optical system is perpendicular to an apparatus installation plane, and
the ion beam irradiation axis is tilted relative to the apparatus installation plane.

5. The ion beam processing apparatus according to claim 1, further comprising:
an electron beam irradiation optical system;
wherein an electron beam irradiation axis and the ion beam irradiation axis intersect substantially above the sample.

6. The ion beam processing apparatus according to claim 2, wherein an electron beam irradiation axis and the ion beam irradiation axis intersect substantially above the sample.

7. The ion beam processing apparatus according to claim 1, further comprising:
an electron beam irradiation optical system;
wherein a tilt angle at which both an electron beam irradiation axis and the ion beam irradiation axis are tilted relative to the first sample stage is substantially 45°.

8. The ion beam processing apparatus according to claim 2, wherein a tilt angle at which both an electron beam irradiation axis and the ion beam irradiation axis are tilted relative to the first sample stage is substantially 45°.

9. The ion beam processing apparatus according to claim 1, wherein the charged particle beam irradiation optical system comprises an ion beam irradiation optical system including a field ionization ion source.

* * * * *

UNITED STATES PATENT AND TRADEMARK OFFICE
CERTIFICATE OF CORRECTION

| | | |
|---|---|---|
| PATENT NO. | : 7,700,931 B2 | Page 1 of 1 |
| APPLICATION NO. | : 11/674262 | |
| DATED | : April 20, 2010 | |
| INVENTOR(S) | : Shichi et al. | |

It is certified that error appears in the above-identified patent and that said Letters Patent is hereby corrected as shown below:

Title Page,

Item (73): delete "Hitachi High-Tchnologies Corporation" and insert --Hitachi High-Technologies Corporation--

Signed and Sealed this
Tenth Day of January, 2012

David J. Kappos
*Director of the United States Patent and Trademark Office*